(12) United States Patent
Watanabe et al.

(10) Patent No.: US 8,339,700 B2
(45) Date of Patent: Dec. 25, 2012

(54) INFRARED REFLECTIVE LAMINATE

(75) Inventors: Atsushi Watanabe, Tokyo (JP); Masanori Hashimoto, Tokyo (JP); Wataru Kakuno, Tokyo (JP)

(73) Assignee: Techno Polymer Co., Ltd, Tokyo (JP)

( * ) Notice: Subject to any disclaimer, the term of this patent is extended or adjusted under 35 U.S.C. 154(b) by 37 days.

(21) Appl. No.: 12/739,575

(22) PCT Filed: Oct. 23, 2008

(86) PCT No.: PCT/JP2008/069228
§ 371 (c)(1),
(2), (4) Date: Apr. 23, 2010

(87) PCT Pub. No.: WO2009/054450
PCT Pub. Date: Apr. 30, 2009

(65) Prior Publication Data
US 2011/0043901 A1 Feb. 24, 2011

(30) Foreign Application Priority Data

Oct. 25, 2007 (JP) ................. 2007-278201
Nov. 5, 2007 (JP) ................. 2007-286972
Jan. 29, 2008 (JP) ................. 2008-017282
Jan. 29, 2008 (JP) ................. 2008-017283

(51) Int. Cl.
*F21V 9/04* (2006.01)
*F21V 9/06* (2006.01)
*G02B 5/08* (2006.01)
*G02B 5/20* (2006.01)
*H01L 31/042* (2006.01)

(52) U.S. Cl. .......... 359/359; 136/246; 204/192.28; 252/582; 359/586; 427/162; 428/213; 428/447; 428/473.5; 428/521; 428/522; 428/523

(58) Field of Classification Search .......... 136/256, 136/246; 359/359, 586; 428/213, 328, 447, 428/473.5, 521, 522, 523, 702; 525/167; 204/192.28; 252/582; 427/162
See application file for complete search history.

(56) References Cited

U.S. PATENT DOCUMENTS

| | | | |
|---|---|---|---|
| 2003/0030041 A1 | 2/2003 | Genjima et al. | |
| 2003/0148093 A1* | 8/2003 | Gorny et al. | 428/328 |
| 2004/0006178 A1* | 1/2004 | Nagahara et al. | 525/70 |
| 2010/0189975 A1* | 7/2010 | Kakuno et al. | 428/213 |

FOREIGN PATENT DOCUMENTS

| | | | |
|---|---|---|---|
| JP | 11-277689 | * | 10/1999 |
| JP | 2001-053298 A | | 2/2001 |
| JP | 2002-060698 A | | 2/2002 |
| JP | 2003-168814 A | | 6/2003 |
| JP | 2006-270025 A | | 10/2006 |
| JP | 2007-103813 A | | 4/2007 |
| JP | 2007-128943 A | | 5/2007 |
| JP | 2007-177136 A | | 7/2007 |

OTHER PUBLICATIONS

International Search Report issued on Jan. 13, 2000 in International Application No. PCT/JP2008/069228.
Japanese Office Action dated Jun. 24, 2012, issued against corresponding JP Application 2008-273548.
Japanese Office Action dated Sep. 4, 2012, issued against corresponding JP Application 2008-273547.

* cited by examiner

*Primary Examiner* — Bijan Ahvazi
(74) *Attorney, Agent, or Firm* — Fitch, Even, Tabin & Flannery, LLP

(57) ABSTRACT

The infrared reflective layered product can reflect infrared radiation with certain wavelengths to prevent heat accumulation while exhibiting excellent heat resistance. The product includes a base layer (B), a layer (A) layered on one side of the layer (B), and a layer (C) layered on the other side of the layer (B). Layer (A) is a colored resin layer which has an absorptance of a light with a wavelength of 800-1400 nm of not more than 10%. Layer (B) is a thermoplastic resin layer which shows a dimensional change (s) satisfying $1\% \geq s \geq -1\%$ when left at 150° C. for 30 min. Layer C is a colored resin layer having a reflectance of a light with a wavelength of 400-1400 nm of not less than 50%. The product may also include a water vapor barrier layer (D).

19 Claims, 2 Drawing Sheets

INFRARED REFLECTIVE LAMINATE

CROSS REFERENCE TO RELATED APPLICATION

This application is a U.S. National Stage entry of International Application No. PCT/JP2008/069228 filed on Oct. 23, 2008, which claims priority to Japanese Application Nos.: 2007-278201, filed Oct. 25, 2007; 2007-286972, filed Nov. 5, 2007; 2008-017282, filed Jan. 29, 2008; and 2008-017283, filed Jan. 29, 2008. The complete disclosures of the referenced international and priority applications are incorporated herein by reference.

TECHNICAL FIELD

The present invention relates to a layered product having a property of absorbing a visible light and reflecting an infrared light so as to prevent heat storage when irradiated with light and excellent in heat resistance, and further relates to an infrared reflective layered product excellent in weatherability, hydrolytic resistance and flexibility. Also, the present invention further relates to an infrared reflective layered product which is excellent in water vapor barrier property and/or prevented from curling.

BACKGROUND ART

Recently, there is a growing demand for solar cells that have been noticed as energy supplying means alternative to petroleum which is a cause of global warming. With the increase in demand for solar cells, stable supply and cost reduction of parts such as back sheets for solar cells have been required, and also there is a growing demand for improving power generation efficiency of solar cells.

Back sheets for solar cells are layered on an encapsulating resin face after encapsulating a silicon cell under the glass plate with the encapsulating resin such as ethylene vinyl acetate resin.

Conventionally, as the back sheet for solar cells, a white thermoplastic resin sheet layered on both faces of a polyester sheet has been used in order to improve reflection of sunlight so as to improve power generation efficiency of solar cells (Patent Documents 1 and 2).

On the other hand, since solar cells are arranged on a house roof, back sheets for solar cells colored in dark colors such as black have been recently required from the viewpoint of design.

However, the conventional black back sheet for solar cells is generally molded by kneading a carbon black into a resin, and thus the carbon black absorbs sunlight and increases the temperature. As a result, power generation efficiency of solar cells is lowered, and durability may also be lowered.

On the other hand, a back sheet for solar cells with low heat storage, which is obtained by kneading an inorganic pigment having an infrared reflecting property in a rubber-reinforced vinyl resin followed by molding, has been also suggested (Patent Document 3), but further improvement in infrared reflectivity has been required.

In addition, a back sheet for solar cells provided on a surface thereof with a black resin layer containing a perylene pigment and having a light reflectance at a wavelength of 800 to 1100 nm of 30% or higher so as to reflect near-infrared light and prevent heat storage is also proposed (Patent Document 4), but since the substrate thereof is made of a polyethylene terephthalate film, it is inferior in weatherability and hydrolytic resistance disadvantageously.

Moreover, since the back sheet is layered on an encapsulating resin surface of solar cells as mentioned above, it is required to have a water vapor barrier property in order to prevent vapor from invading the encapsulating resin from the back sheet and deteriorating silicone cells.

Patent Document 1: Japanese Patent Laid-open No. 2006-270025

Patent Document 2: Japanese Patent Laid-open No. 2007-177136

Patent Document 3: Japanese Patent Laid-open No. 2007-103813

Patent Document 4: Japanese Patent Laid-open No. 2007-128943

DISCLOSURE OF THE INVENTION

Problems to be Solved by the Invention

The present invention aims at providing an infrared reflective layered product which has a property of reflecting an infrared radiation with a specific wavelength so as to prevent heat storage even with black colored or chromatically colored appearance, and also, is small in thermal deformation and excellent in heat resistance, and further, is difficult to hydrolyze and excellent in weatherability even when used outside for a long time, difficult to crack and excellent in flexibility even in a form of film, and good in processability, productivity and handleability.

In addition, the present invention aims at providing an infrared reflective layered product which is further prevented from curling.

Moreover, the present invention aims at providing a layered product which is an infrared reflective layered product excellent in water vapor barrier property, and particularly suitable for a back sheet for solar cells.

Means for Solving the Problem

As a result of intensive studies for solving the above problem, the present inventors have found that a layered product, which has a property of reflecting infrared radiation so as to prevent heat storage even with a colored appearance and is excellent in heat resistance, can be obtained by arranging a colored resin layer which is low in infrared light absorption on one side of a thermoplastic resin layer having a specific heat resistance and arranging a colored resin layer which is high in light reflection on the other side of the thermoplastic resin layer. Thus, the present invention has been completed.

In addition, the present inventors have found that curling can be prevented when a thickness of each layer of the above layered product satisfies a specific relation, and further, a layered product excellent in water vapor barrier property can be obtained by arranging a water vapor barrier layer on an outer surface or between layers of the above layered product. Thus, the present invention has been completed.

That is, the present invention provides an infrared reflective layered product comprising:

the following layer (B) as a base layer;

the following layer (A) layered on one side of the layer (B); and the following layer (C) layered on the other side of the layer (B).

Layer (A): a colored resin layer having an absorptance of a light with a wavelength of 800-1400 nm of not more than 10%.

Layer (B): a thermoplastic resin layer which shows a dimensional change (s) satisfying 1%≧s≧−1% when left at 150° C. for 30 minutes.

Layer (C): a colored resin layer having a reflectance of a light with a wavelength of 400-1400 nm of not less than 50%.

In addition, according a preferable embodiment of the present invention, there is provided the above layered product which comprises a water vapor barrier layer (D) layered on the outer surface of the above layer (A) or the above layer (C), or between the above layer (A) and the above layer (B) or the above layer (B) and the above layer (C).

When the above layered product does not comprise the water vapor barrier layer (D), it is preferable to comprise a protective layer (E) on the outer surface of the above layer (A) and/or on the outer surface of the above layer (C).

Also, when the above layered product comprises the water vapor barrier layer (D), it is preferable to comprise the protective layer (E) on the layer (C) side as the outermost layer.

In addition, according another preferable embodiment of the present invention, there is provided the above layered product in which a thickness ($H_A$) of the above layer (A), a thickness ($H_B$) of the above layer (B) and a thickness ($H_C$) of the above layer (C) satisfy the following expressions (2) and (3).

$$0.5 \leq H_A/H_C \leq 1.3 \quad (2)$$

$$0.4 \leq (H_A+H_C)/H_B \leq 2.4 \quad (3)$$

Moreover, according to still another preferable embodiment of the present invention, there are provided a back sheet for solar cells comprising the above layered product of the present invention, and a solar cell module comprising the back sheet.

Effect of the Invention

The layered product of the present invention comprises the infrared transmittable colored resin layer (A) layered on one face of the heat-resistant thermoplastic resin layer (B), and the infrared reflective resin layer (C) layered on the other face thereof. Thus, when light is applied onto the colored resin layer (A), the colored layer (A) absorbs a visible light and exhibits colored appearance, but transmits an infrared light to the inside, and the infrared light transmitted from the above layer (B) is reflected by the resin layer (C) and again emitted from the above layer (B) and the above layer (A).

Therefore, the infrared reflective layered product of the present invention is suitable for uses requiring an infrared reflecting or radiating function such as a back sheet for solar cells, and since it is prevented from heat generation or heat storage caused by the infrared light and provided with heat resistance, it is suitable for use with an outdoor device which is exposed to sunlight and a device which radiates an infrared light.

The infrared reflective layered product of the present invention can be easily produced because all the three layers can be constituted as molded resin layers.

The infrared reflective layered product of the present invention does not cause curing when the thickness of each layer (A) to (C) satisfies the predetermined relation.

When the infrared reflective layered product of the present invention is used as a back sheet for solar cells, infrared light is transmitted from the above layer (B) and is reflected by the resin layer (C) and again radiated from the above layer (B) and the above layer (A), and thus power generation efficiency of solar cells is improved.

When the infrared reflective layered product of the present invention is provided with the water vapor barrier, it is suitable for use in the outside exposed to sunlight, wind and rain for a long time, and when it is used as a back sheet for solar cells, it prevents deterioration of silicon cells of solar cells.

BEST MODE FOR CARRYING OUT THE INVENTION

Hereinafter, the present invention is described in detail. In this specification, the term "(co)polymer" means homopolymer and copolymer, the term "(meth)acryl" means acryl and/or methacryl, and the term "(meth)acrylate" means acrylate and/or methacrylate.

Base Layer of the Present Invention (Layer (B))

The above layer (B) constituting the base layer of the infrared reflective layered product of the present invention is a thermoplastic resin layer of which a dimensional change (s) satisfies 1%≧s≧−1% when left at 150° C. for 30 minutes. The base layer provides durability for long term use under irradiation of light such as sunlight, and concurrently has a function of minimizing a dimensional change caused by thermal contraction and thermal expansion even when the present layered product undergoes a dynamic temperature change history during drying or surface treatment of the layered product after printing or during another secondary process. Also, the base layer has a function of transmitting an infrared radiation transmitted from the above layer (A), and also transmitting the infrared radiation reflected from the above layer (C), and the higher the transmittance of the infrared radiation transmitted from the above layer (A) is, the better the layer (B) becomes. The layer (B) having such a function can be usually produced by molding a resin without any coloring agent into a film or sheet, and is preferably transparent or semi-transparent, and more preferable transparent.

The thermoplastic resin (I) constituting the base layer (hereinafter, also referred to as "Component (I)") is not particularly limited as long as it satisfies the above dimensional change, but includes vinyl resins (for example, styrene resins, rubber-reinforced styrene resins, acrylonitrile/styrene resins, and aromatic vinyl resins such as (co)polymers of aromatic vinyl compounds), polyolefin resins (for example, polyethylene resins, polypropylene resins, ethylene-α-olefin resins, and the like), polyvinyl chloride resins, polyvinylidene chloride resins, polyvinyl acetate resins, saturated polyester resins, polycarbonate resins, acrylic resins (for example, (co) polymers of (meth)acrylate compounds), fluorocarbon resins, ethylene/vinyl acetate resins and the like. These can be used alone or in combination of two or more.

From the viewpoint of heat resistance, the thermoplastic resin (I) has a glass transition temperature of preferably 120° C. or higher, more preferably 120-220° C., further more preferably 130-190° C., still furthermore preferably 140-170° C. and particularly preferably 145-160° C. When the glass transition temperature is less than 120° C., heat resistance is not sufficient.

Examples of the thermoplastic resin (I) typically include a vinyl resin (I'), that is, a rubber-reinforced vinyl resin (I-1) obtained by polymerization of a vinyl monomer (ii) in the presence of a rubber-like polymer (i) and/or a (co)polymer (I-2) of a vinyl monomer (ii). The latter (co)polymer (I-2) can be obtained by polymerization of the vinyl monomer (ii) in the absence of the rubber-like polymer (i). The rubber-reinforced vinyl resin (I-1) usually includes copolymers in which the above vinyl monomer (ii) is graft-copolymerized onto the rubber-like polymer (i) and an ungrafted component which is made from the vinyl monomer (ii) but is not grafted onto the rubber-like polymer (i) (one which is of the same type as the above (co)polymer (I-2)).

Among these, a preferable thermoplastic resin (I) is a rubber-reinforced styrene resin (I-1') obtained by polymerization of a vinyl monomer (ii') comprising an aromatic vinyl compound and optionally another monomer copolymerizable with the aromatic vinyl compound in the presence of a rubber-like polymer (i), and/or a (co)polymer (I-2') of the vinyl monomer (ii').

The thermoplastic resin (I) of the present invention preferably contains at least one kind of the rubber-reinforced vinyl resin (I-1) from the viewpoint of impact resistance and flexibility, and may contain the (co)polymer (I-2), if required. The content of the rubber-like polymer (i) is preferably 5-40 parts by mass, more preferably 8-30 parts by mass, furthermore preferably 10-20 parts by mass, and particularly preferably 12-18 parts by mass relative to 100 parts by mass of Component (I). When the content of the rubber-like polymer (i) exceeds 40 parts by mass, heat resistance is not sufficient, and processing into a film may be difficult. On the other hand, when the content of the rubber-like polymer (i) is less than 5 parts by mass, impact resistance and flexibility may be insufficient.

The vinyl resin (I') preferably comprises, as the vinyl monomer (ii), a maleimide compound unit from the viewpoint of heat resistance. The content of the maleimide compound unit is usually preferably 0-30 mass %, more preferably 1-30 mass %, further more preferably 5-27 mass %, still furthermore preferably 10-27 mass % and particularly preferably 15-25 mass % relative to 100 mass % of the thermoplastic resin (I'). When the content of the maleimide compound unit exceeds 30%, flexibility of the layered product may be insufficient. Also, the maleimide compound unit may be originated from the rubber-reinforced vinyl resin (I-1) or may be originated from the (co)polymer (I-2). The glass transition temperature of the vinyl resin (I') can be adjusted by the content of the maleimide compound unit as described later, and the (co)polymer (I-2) containing the maleimide compound unit as a constituent monomer is advantageous for preparing the vinyl resin (I') having a desired glass transition temperature.

The above rubber-like polymer (i) includes but is not particularly limited to conjugated-diene rubbers such as polybutadiene, butadiene/styrene random copolymers, butadiene/styrene block copolymers and butadiene/acrylonitrile copolymers, and the hydrogenated products thereof (that is, hydrogenated conjugated diene rubbers) as well as non-diene rubbers such as ethylene-α-olefin rubbers, acrylic rubbers, silicone rubbers and silicone/acrylic composite rubbers, and these can be used alone or in combination of two or more.

Among these, ethylene-α-olefin rubbers (i-1), hydrogenated conjugated-diene rubbers (i-2), acrylic rubbers (i-3), silicone rubbers (i-4) and silicone/acrylic composite rubbers (i-5) are preferable from the viewpoint of weatherability. Among them, acrylic rubbers (i-3), silicone rubbers (i-4) and silicone/acrylic composite rubbers (i-5) are more preferable, and silicone/acrylic composite rubbers (i-5) are particularly preferable from the viewpoint of flexibility. These can be used alone or in combination of two or more.

Examples of ethylene-α-olefin rubbers (i-1) include ethylene/α-olefin copolymers and ethylene/α-olefin/non-conjugated diene copolymers. Examples of the α-olefin constituting the ethylene-α-olefin rubber (i-1) include an α-olefin with 3-20 carbon atoms, and concretely, propylene, 1-butene, 1-pentene, 1-hexene, 4-methyl-1-pentene, 1-heptene, 1-octene, 1-decene, 1-dodecene, 1-hexadecene and 1-eicocene. These α-olefins can be used alone or in combination of two or more. The number of carbon atoms of the α-olefin is preferably 3-20, more preferably 3-12, and furthermore preferably 3-8. When the number of carbon atoms exceeds 20, copolymerizability is lowered, and surface appearance of molded articles may become insufficient. As a typical ethylene-α-olefin rubber (i-1), ethylene/propylene copolymers, ethylene/propylene/non-conjugated diene copolymers, ethylene/1-butene copolymers and ethylene/1-butene/non-conjugated diene copolymers are included. The mass ratio of ethylene/α-olefin is preferably 5-95/95-5, more preferably 50-90/50-10, furthermore preferably 60-88/40-12 and particularly preferably 70-85/30-15. When the mass ratio of α-olefin exceeds 95, weatherability is not sufficient. On the other hand, when it is less than 5, rubber elasticity of the rubber-like polymer is not sufficient, and thus flexibility for a film may be insufficient.

The non-conjugated diene includes alkenyl norbornenes, cyclic dienes and aliphatic dienes, and preferably includes 5-ethylidene-2-norbornene and dicyclopentadiene. These non-conjugated dienes can be used alone or in combination of two or more. The ratio of the non-conjugated diene is preferably 0-30 mass %, more preferably 0-20 mass % and furthermore preferably 0-10 mass % relative to the total amount of the ethylene-α-olefin rubbers (i-1). When the ratio of the non-conjugated diene exceeds 30 mass %, appearance of molded articles and weatherability may be insufficient. The amount of unsaturated groups in the ethylene-α-olefin rubber (i-1) is preferably in a range of 4-40 in terms of iodine value.

Mooney viscosity of the ethylene-α-olefin rubber (i-1) ($ML_{1+4}$, 100° C.; according to JIS K6300) is preferably 5-80, more preferably 10-65 and furthermore preferably 15-45. When the Mooney viscosity of the Component (i-1) exceeds 80, polymerization may become difficult, and when the Moony viscosity of the Component is less than 5, impact resistance and flexibility for a film may be insufficient.

The hydrogenated conjugated diene rubber (i-2) includes, for example, hydrogenated products of the conjugated diene block copolymer having the following structure. That is, a block copolymer comprising two or more of a polymer block A composed of an aromatic vinyl compound unit, a polymer block B in which 95 mol % or more of the double bonds of a polymer made from a conjugated diene compound unit with a 1,2-vinyl bond content of more than 25 mol % is hydrogenated, a polymer block C in which 95 mol % or more of the double bonds of a polymer made from a conjugated diene compound unit with a 1,2-vinyl bond content of not more than 25 mol % is hydrogenated, and a polymer block D in which 95 mol % or more of the double bonds of a copolymer of an aromatic vinyl compound unit with a conjugated diene compound unit is hydrogenated.

Examples of aromatic vinyl compounds used for the production of the above polymer block A include styrene, α-methyl styrene and other methyl styrenes, vinyl xylene, monochlorostyrene, dichlorostyrene, monobromostyrene, dibromostyrene, fluorostyrene, p-t-butylstyrene, ethylstyrene and vinylnaphthalene, and these can be used alone or in combination of two or more. Above all, preferable one is styrene. The ratio of a polymer block A in the block copolymer is preferably 0-65 mass % and further preferably 10-40 mass %. When the polymer block A exceeds 65 mass %, impact resistance may be insufficient.

The above polymer blocks B, C and D can be obtained by hydrogenating a polymer of a conjugated diene compound. The conjugated diene compound used for the production of the above polymer blocks B, C and D include, for example, 1,3-butadiene, isoprene, 1,3-pentadiene and chloroprene, but in order to obtain the hydrogenated conjugated diene rubbers (i-2) which can be utilized industrially and is excellent in property, 1,3-butadiene and isoprene are preferable. These can be used alone or in combination of two or more. The aromatic vinyl compound used for the production of the above polymer block D includes the same as the aromatic vinyl compound used for the production of the above polymer block A, and these can be used alone or in combination of two or more. Above all, preferable one is styrene.

The hydrogenation ratio of the above polymer blocks B, C and D is 95 mol % or more, and preferably 96 mol % or more. When it is less than 95 mol %, gelation occurs during polymerization, and thus polymerization may not be stably performed. The 1,2-vinyl bond content of the polymer block B is preferably more than 25 mol % and not more than 90 mol %, and further preferably 30-80 mol %. When the 1,2-vinyl bond content of the polymer block B is not more than 25 mol %, rubbery properties are lost so that impact resistance may be insufficient, and when it exceeds 90 mol %, chemical resistance may be insufficient. The 1,2-vinyl bond content of the polymer block C is preferably not more than 25 mol %, and further preferably not more than 20 mol %. When the 1,2-vinyl bond content of the polymer block C exceeds 25 mol %, scratch resistance and sliding properties may not be exhibited sufficiently. The 1,2-vinyl bond content of the polymer block D is preferably 25-90 mol %, and further preferably 30-80 mol %. When the 1,2-vinyl bond content of the polymer block D is less than 25 mol %, rubbery properties are lost so that impact resistance may be insufficient, and when it exceeds 90 mol %, chemical resistance may be obtained sufficiently. Also, the content of the aromatic vinyl compound of the polymer block D is preferably not more than 25 mass % and further preferably not more than 20 mass %. When the content of an aromatic vinyl compound of the polymer block D exceeds 25 mass %, rubbery properties are lost so that impact resistance may be insufficient.

The molecular structure of the above block copolymer may be branched, radial or in combination of these, and the block structure thereof may be diblock, triblock or multiblock or a combination of these. Examples are block copolymers represented by A-(B-A)$_n$, (A-B)$_n$, A-(B-C)$_n$, C-(B-C)$_n$, (B-C)$_n$, A-(D-A)$_n$, (A-D)$_n$, A-(D-C)$_n$, C-(D-C)$_n$, (D-C)$_n$, A-(B-C-D)$_n$ or (A-B-C-D)$_n$ (where n is an integer of not less than 1), and preferably a block copolymer having a structure of A-B-A, A-B-A-B, A-B-C, A-D-C or C-B-C.

The weight average molecular weight (Mw) of the above hydrogenated conjugated diene rubber (i-2) is preferably 10,000-1,000,000, more preferably 30,000-800,000, and further more preferably 50,000-500,000. When Mw is less than 10,000, flexibility for a film may be insufficient, and on the other hand, when it exceeds 1,000,000, polymerization may be difficult.

The acrylic rubber (i-3) is a polymer of an alkyl acrylate having an alkyl group with 2-8 carbon atoms. Concrete examples of the alkyl acrylate include ethyl acrylate, propyl acrylate, n-butyl acrylate, isobutyl acrylate, hexyl acrylate, n-octyl acrylate and 2-ethylhexyl acrylate. These can be used alone or in combination of two or more. A preferable alkyl acrylate is (n-, i)-butyl acrylate or 2-ethylhexyl acrylate. A part of the alkyl acrylate can be substituted by another copolymerizable monomer in an amount of 20 mass % at maximum. Another monomer as above includes, for example, vinylchloride, vinylidene chloride, acrylonitrile, vinylester, alkyl methacrylate, methacrylic acid, acrylic acid and styrene.

It is preferable that kinds and amounts of monomers to be copolymerized for the acrylic rubber (i-3) are selected so that it has a glass transition temperature of not more than −10° C. Also, it is preferable to appropriately copolymerize a crosslinkable monomer in the acrylic rubber, and the amount of the crosslinkable monomer to be used is usually 0-10 mass %, preferably 0.01-10 mass % and further preferably 0.1-5 mass % as a proportion relative to the acrylic rubber (i-3).

Concrete examples of the crosslinkable monomer include mono or polyethylene glycol diacrylates such as ethylene glycol diacrylate, diethylene glycol diacrylate, triethylene glycol diacrylate, tetraethylene glycol diacrylate, mono or polyethylene glycol dimethacrylates such as ethylene glycol dimethacrylate, diethylene glycol dimethacrylate, triethylene glycol dimethacrylate, tetraethylene glycol dimethacrylate, di or triallyl compounds such as divinylbenzene, diallylphthalate, diallylmaleate, diallylsuccinate and triallyltriazine, allyl compounds such as allylmethacrylate and allylacrylate, and conjugated diene compounds such as 1,3-butadiene. The above acrylic rubber is produced by known polymerization methods, and a preferable polymerization method is emulsion polymerization.

As the silicone rubber (i-4), all which can be obtained by known polymerization methods can be used, and polyorganosiloxane rubber-like polymer latex obtained in a form of latex by emulsion polymerization is preferable from the view point of easiness of graft polymerization.

The latex of the polyorganosiloxane rubber-like polymer can be obtained by the known method described in, for example, U.S. Pat. Nos. 2,891,920 and 3,294,725 specifications. For example, a method in which an organosiloxane and water are shear-mixed and then condensation-polymerized in the presence of a sulfonic acid emulsifier such as alkylbenzene sulfonic acid and alkylsulfonic acid using a homomixer or ultrasonic mixer. The alkylbenzene sulfonic acid is suitable because it acts as an emulsifier for the organosiloxane as well as a polymerization initiator. In this instance, it is preferable to use an alkylbenzene sulfonic acid metal salt or alkylsulfonic acid metal salt in combination, because they are effective for maintaining polymers to be stable during graft polymerization. If necessary, a grafting agent or crosslinking agent may be condensation-polymerized together to an extent that does not impair the aimed property of the present invention.

The organosiloxane to be used is, for example, one having a structural unit represented by the general formula $R_m SiO_{(4-m)/2}$ (wherein R is a substituted or unsubstituted monovalent hydrocarbon group, and m indicates an integer of 0 to 3), and has a linear, branched or cyclic structure, and is preferably an organosiloxane having a cyclic structure. The substituted or unsubstituted monovalent hydrocarbon group of the organosiloxane includes, for example, methyl group, ethyl group, propyl group, phenyl group and these hydrocarbon groups substituted with a cyano group or the like.

Concrete examples of the organosiloxane include cyclic compounds such as hexamethylcyclotrisiloxane, octamethylcyclotetrasiloxane, decamethylcyclopentasiloxane, dodecamethylcyclohexasiloxane, trimethyltriphenylcyclotrisiloxane, and a linear or branched organosiloxane. These can be used alone or in combination of two or more.

The organosiloxane may be a polyorganosiloxane that is previously condensation-polymerized to have a polystyrene-equivalent weight-average molecular weight of, for example, about 500-10,000. Also, when the organosiloxane is a polyorganosiloxane, a molecular chain terminal thereof may be blocked, for example, by hydroxyl group, alkoxy group, trimethylsilyl group, dimethylvinylsilyl group, methylphenylvinylsilyl group and methyldiphenylsilyl group.

As the grafting agent, for example, a compound having both unsaturated group and alkoxysilyl group can be used. Concrete examples of such a compound include p-vinylphenylmethyldimethoxysilane, 1-(m-vinylphenyl)methyldimethylisopropoxysilane, 2-(p-vinylphenyl)ethylmethyldimethoxysilane, 3-(p-vinylphenoxy)propylmethyldiethoxysilane, 3-(p-vinylbenzoyloxy)propylmethyldimethoxysilane, 1-(o-vinylphenyl)-1,1,2-trimethyl-2,2-dimethoxydisilane, 1-(p-vinylphenyl)-1,1-diphenyl-3-ethyl-3,3-diethoxydisiloxane, m-vinylphenyl-[3-(triethoxysilyl)propyl]diphenylsilane, [3-(p-isopropenylbenzoylamino)propyl]phenyldipropoxysilane, 2-(m-vinylphenyl)ethylmethyldimethoxysilane, 2-(o-vinylphenyl)ethylmethyldimethoxysilane, 1-(p-vinylphenyl)ethylmethyldimethoxysilane, 1-(m-vinylphenyl)ethylmethyldimethoxysilane, 1-(o-vinylphenyl)ethylmethyldimethoxysilane, and a mixture of these. Of these, p-vinylphenylmethyldimethoxysilane, 2-(p-vinylphenyl)ethylmethyldimethoxysilane, and 3-(p-vinylbenzoyloxy)propylmethyldimethoxysilane are preferable, and p-vinylphenylmethyldimethoxysilane is further preferable.

The ratio of the grafting agent to be used is usually 0-10 parts by mass, preferably 0.2-10 parts by mass and further preferably 0.5-5 parts by mass relative to 100 parts by mass of the total amount of the organosiloxane, grafting agent and crosslinking agent. When the amount of the grafting agent to be used is too much, the molecular weight of the grafted vinyl polymer is lowered, and as a result, sufficient impact resistant cannot be obtained. In addition, oxidative degradation easily proceeds at double bonds of the grafted polyorganosiloxane rubber-like polymer, and thus a graft copolymer with good weatherability cannot be obtained.

An average particle diameter of particles of the polyorganosiloxane rubber-like polymer latex is usually not more than 0.5 μm, preferably not more than 0.4 μm, and further preferably 0.05-0.4 μm. The average particle diameter can be easily controlled by amounts of the emulsifier and water, a degree of dispersion upon mixing with the homomixer or ultrasonic mixer, or a way of charging the organosiloxane. When the average particle diameter of latex particles exceeds 0.5 μm, gloss is inferior.

The polystyrene-equivalent weight-average molecular weight of the polyorganosiloxane rubber-like polymer obtained as above is usually 30,000-1,000,000, and preferably 50,000-300,000. When the weight average molecular weight is less than 30,000, flexibility for a film may be insufficient. On the other hand, when the weight-average molecular weight exceeds 1,000,000, entanglement within rubber polymer chains becomes strong, and rubber elasticity is lowered, and thus flexibility for a film is lowered, or graft particles are hardly melted, and film appearance may be impaired.

The weight-average molecular weight can be easily controlled by temperature and time of condensation polymerization during preparation of polyorganosiloxane rubber-like polymers. That is, the lower the temperature of condensation polymerization is and/or the longer the cooling time is, the higher the molecular weight of the polymer is. Also, the polymer can be made high in molecular weight by adding a small amount of a crosslinking agent.

Meanwhile, the molecular chain terminal of the polyorganosiloxane rubber-like polymer may be blocked, for example, by hydroxyl group, alkoxy group, trimethylsilyl group, dimethylvinylsilyl group, methylphenylvinylsilyl group or methyldiphenylsilyl group.

The amount of the emulsifier to be used is usually 0.1-5 parts by mass and preferably 0.3-3 parts by mass relative to 100 parts by mass of the total of the organosiloxane, grafting agent and crosslinking agent. The amount of water to be used in this instance is usually 100-500 parts by mass and preferably 200-400 parts by mass relative to 100 parts by mass of the total of the organosiloxane, grafting agent and crosslinking agent. The condensation polymerization temperature is usually 5-100° C.

During production of the polyorganosiloxane rubber-like polymer, a crosslinking agent can be added as the third component in order to improve impact resistance of the resulting graft copolymer. The crosslinking agent includes, for example, trifunctional crosslinking agents such as methyl trimethoxysilane, phenyl trimethoxysilane and ethyl triethoxysilane, and tetrafunctional crosslinking agents such as tetraethoxysilane. These can be used in combination of two or more. As these crosslinking agents, crosslinked pre-polymers that are previously condensation-polymerized can be used. The addition amount of the crosslinking agent is usually not more than 10 parts by mass, preferably not more than 5 parts by mass and further more preferably 0.01-5 parts by mass relative to 100 parts by mass of the total amount of the organosiloxane, grafting agent and crosslinking agent. When the addition amount of the above crosslinking agent exceeds 10 parts by mass, flexibility of polyorganosiloxane rubber-like polymers may be impaired so that flexibility for a film may be lowered.

The silicone/acrylic composite rubber (i-5) means a rubber-like polymer comprising a polyorganosiloxane rubber and a polyalkyl(meth)acrylate rubber. A preferable silicone/acrylic composite rubber (i-5) is a composite rubber having a structure in which a polyorganosiloxane rubber and a polyalkyl(meth)acrylate rubber are entangled with each other so as to be inseparable.

The above polyalkyl(meth)acrylate rubber includes, for example, one which can be obtained by copolymerizing an alkyl(meth)acrylate (monomer) such as methyl acrylate, ethyl acrylate, n-propyl acrylate, n-butyl acrylate, 2-ethylhexyl acrylate, ethoxyethoxyethyl acrylate, methoxy tripropylene glycol acrylate, 4-hydroxybutyl acrylate, lauryl methacrylate and stearyl methacrylate. These alkyl(meth)acrylates can be used alone or in combination of two or more.

The above alkyl(meth)acrylate monomer may further comprise various vinyl monomers including aromatic vinyl compounds such as styrene, α-methyl styrene and vinyl toluene; vinyl cyanide compounds such as acrylonitrile and methacrylonitrile; silicones modified with methacrylic acids; and fluorine-containing vinyl compounds in a range of not more than 30 mass % as comonomers.

The above polyalkyl(meth)acrylate rubber is preferably a copolymer having two or more glass transition temperatures. Such a polyalkyl(meth)acrylate rubber is preferable in order to exhibit flexibility of films.

As the above polyorganosiloxane rubber, can be used one resulting from copolymerization of an organosiloxane. The above organosiloxane includes a variety of reduced products with 3- or more membered ring, and preferably includes, for example, hexamethylcyclotrisiloxane, octamethylcyclotetrasiloxane, decamethylcyclopentasiloxane, dodecamethylcyclohexasiloxane, trimethyltriphenylcyclotrisiloxane, tetramethyltetraphenylcyclotetrasiloxane and octaphenylcyclotetrasiloxane. These organosiloxanes can be used alone or in combination of two or more. The amount of these organosiloxanes to be used is preferably not less than 50 mass %, and more preferably not less than 70 mass % relative to the polyorganosiloxane rubber components.

A silicone/acrylic composite rubber (i-5) can be produced, for example, by methods described in such as JP-A-H04-239010 and JP-B-2137934. As such a silicone/acrylic composite rubber graft copolymer, "METABLENE SX-006 (trade name)" manufactured by MITSUBISHI RAYON CO., LTD. is commercially available.

The vinyl monomer (ii) in the present invention typically includes aromatic vinyl compounds and vinyl cyanide compounds, and is preferably one comprising both an aromatic vinyl compound and a vinyl cyanide compound.

The aromatic vinyl compounds include, for example, styrene, α-methyl styrene and other methyl styrene, vinyl toluene, vinyl xylene, ethyl styrene, dimethyl styrene, p-tert-butyl styrene, vinyl naphthalene, methoxy styrene, monobromo styrene, dibromo styrene, tribromo styrene and fluorostyrene. Of these, styrene and α-methyl styrene are preferable. These aromatic vinyl compounds can be used alone or in combination of two or more.

The vinyl cyanide compounds include acrylonitrile, methacrylonitrile and α-chloro(meth)acrylonitrile. Of these, acrylonitrile is preferable. These vinyl cyanide compounds can be used alone or in combination of two or more.

As the vinyl monomer (ii), can be used, in addition to the aromatic vinyl compound and the vinyl cyanide compound, another compound copolymerizable with these. Such another compound includes (meth)acrylates, maleimide compounds, other functional group-containing unsaturated compounds (for example, unsaturated acids, epoxy group-containing unsaturated compounds, hydroxyl group-containing unsaturated compounds, oxazoline group-containing unsaturated compounds and acid anhydride group-containing unsaturated compounds). These can be used alone or in combination of two or more. The amount of such another compound to be used is preferably 0-50 mass %, more preferably 1-40 mass % and further more preferably 1-30 mass %, provided that the vinyl monomer (ii) is 100 mass %.

The (meth)acrylate includes, for example, methyl(meth)acrylate, ethyl(meth)acrylate, n-propyl(meth)acrylate, isopropyl(meth)acrylate, n-butyl(meth)acrylate and isobutyl (meth)acrylate. These can be used alone or in combination of two or more. Of these, methyl methacrylate is preferable.

The unsaturated acid includes, for example, acrylic acid, methacrylic acid, itaconic acid and maleic acid. These can be used alone or in combination of two or more.

The maleimide compound includes, for example, maleimide, N-methylmaleimide, N-butylmaleimide, N-phenylmaleimide and N-cyclohexylmaleimide. These can be used alone or in combination of two or more. In order to introduce a maleimide compound unit into a copolymerized resin, maleic anhydride may be first (co)polymerized, followed by imidation. Containing a maleimide compound as another copolymerizable compound is preferable from the viewpoint of improving heat resistance of the thermoplastic resin (I).

The content of the maleimide compound is usually preferably 0-30 mass %, more preferably 1-30 mass %, further more preferably 5-27 mass %, still furthermore preferably 10-27 mass % and particularly preferably 15-25 mass % as the maleimide compound unit relative to 100 mass % of the above thermoplastic resin (I). When the maleimide compound unit is less than 1 mass %, heat resistance may be insufficient. On the other hand, when it exceeds 30 mass %, flexibility for a film may be insufficient.

The epoxy group-containing unsaturated compound includes, for example, glycidyl acrylate, glycidyl methacrylate and allyl glycidyl ether, and these can be used alone or in combination of two or more.

The hydroxyl group-containing unsaturated compound includes, for example, 3-hydroxy-1-propene, 4-hydroxy-1-butene, cis-4-hydroxy-2-butene, trans-4-hydroxy-2-butene, 3-hydroxy-2-methyl-1-propene, 2-hydroxyethyl acrylate, 2-hydroxyethyl methacrylate and hydroxystyrene. These can be used alone or in combination of two or more.

The oxazoline group-containing unsaturated compound includes, for example, vinyl oxazolines. These can be used alone or in combination of two or more.

The acid anhydride group-containing unsaturated compound includes, for example, maleic anhydride, itaconic anhydride and citraconic anhydride. These can be used alone or in combination of two or more.

As the above vinyl monomer (ii), one which is mainly composed of an aromatic vinyl compound and a vinyl cyanide compound is preferable, and the total amount of these compounds is preferably 70-100 mass % and further preferably 80-100 mass % relative to the total amount of the vinyl monomer. The ratio of an aromatic vinyl compound and an vinyl cyanide compound to be used is preferably 5-95 mass % and 5-95 mass %, more preferably 50-95 mass % and 5-50 mass %, further more preferably 60-95 mass % and 5-40 mass % and particularly preferably 65-85 mass % and 15-35 mass % respectively, provided that the total of these is 100 mass %.

According to a preferable embodiment of the present invention, as the thermoplastic resin (I), is used a rubber-reinforced styrene resin which comprises a rubber-reinforced styrene resin (I-1') obtained by polymerization of a vinyl monomer (ii') containing an aromatic vinyl compound in the presence of a rubber-like polymer (i) selected from the group consisting of acrylic rubbers (i-3), silicone rubbers (i-4) and silicone/acrylic composite rubbers (i-5) and optionally a (co) polymer (I-2') of a vinyl monomer (ii). Of these, preferable are a silicone/acrylic composite rubber-reinforced styrene resin using a silicone/acrylic composite rubber (i-5) as the rubber-like polymer (i), and a mixture of a silicone rubber-reinforced styrene resin using a silicone rubber (i-4) as the rubber-like polymer (i) and an acrylic rubber-reinforced styrene resin using an acrylic rubber (i-3) as the rubber-like polymer (i), and particularly preferable is the silicone/acrylic composite rubber-reinforced styrene resin.

The rubber-reinforced vinyl resin (I-1) can be obtained by known polymerization methods such as emulsion polymerization, suspension polymerization, solution polymerization, bulk polymerization and polymerization methods in combination of these.

The graft ratio of the rubber-reinforced vinyl resin (I-1) is preferably 20-170%, more preferably 30-170%, further more preferably 40-150% and particularly preferably 50-150%. When the graft ratio is too low, flexibility for a film may be insufficient. When it is too high, viscosity of the thermoplastic resin becomes high so that a thin product may be difficult to make.

The graft ratio can be determined by the following equation.

$$\text{Graft ratio (mass \%)} = \{(S-T)/T\} \times 100$$

In the above equation, S is the mass (g) of insoluble matter obtained by adding 1 g of the rubber-reinforced vinyl resin (I-1) into 20 ml of acetone (but acetonitrile when an acrylic rubber is used), shaking the mixture for 2 hours by a shaker under the temperature of 25° C., and then centrifuging the mixture by a centrifuge (at a rotation speed of 23,000 rpm) for 60 minutes under the temperature of 5° C. to separate the insoluble matter from soluble matter, and T is the mass (g) of the rubber-like polymer contained in 1 g of the rubber-reinforced vinyl resin (I-1). The mass of the rubber-like polymer can be obtained by a method of calculating based on polymerization prescription and polymerization conversion, a method of determining from infrared absorption spectrum (IR) and the like.

Meanwhile, the graft ratio can be adjusted by appropriately selecting, for example, kind and amount of a chain transfer agent used in the production of the rubber-reinforced vinyl resin (I-1), kind and amount of a polymerization initiator, method of addition and duration of addition of monomer components during polymerization, and polymerization temperature.

The limiting viscosity [η] (measured at 30° C. in methyl ethyl ketone) of the soluble matter in acetone (but acetonitrile when acrylic rubber is used) of the rubber-reinforced resin (I-1) is preferably 0.1 to 2.5 dl/g, more preferably 0.2 to 1.5 dl/g, and further more preferably 0.25 to 1.2 dl/g. It is preferable that the limiting viscosity is within this range from the viewpoint of processability of a film and thickness accuracy of layered products.

The limiting viscosity [η] of the soluble matter in acetone (but acetonitrile when acrylic rubber is used) of the rubber-reinforced resin (I-1) is measured by the following method. First, the soluble matter in acetone (but acetonitrile when acrylic rubber is used) of the rubber-reinforced resin (I-1) is dissolved in methyl ethyl ketone to make five samples different in concentration. Then, the limiting viscosity [η] is obtained from the results of a reduced viscosity measured at each concentration at 30° C. using the Ubbelohde viscometer tube. The unit is dl/g.

The limiting viscosity [η] can be adjusted by appropriately selecting, for example, kind and amount of a chain transfer agent used in the production of the rubber-reinforced vinyl resin (I-1), kind and amount of a polymerization initiator, method of addition and duration of addition of monomer components during polymerization, and polymerization temperature. Also, it can be adjusted by appropriately selecting and blending (co)polymers (I-2) different in limiting viscosity [η].

The thermoplastic resin (I) may be pelletized by previously blending required amounts of the respective components, mixing the blend in a Henschel mixer or the like, and then melt-kneading it in an extruder, or may be processed into a film or sheet by directly supplying the respective components to a film forming machine or extruding machine. In this instance, antioxidants, ultraviolet absorbents, weather resistant agents, anti-aging agents, fillers, antistatic agents, flame retardants, antifogging agents, slipping agents, antibacterial agents, fungicides, tackifiers, plasticizers, coloring agents, graphite, carbon black, carbon nanotube, and pigments (including a pigment to which functionality such as an infrared absorbing or reflecting property is imparted) can be added to the thermoplastic resin (I) in an amount which does not impair the object of the present invention.

Colored Resin Layer of the Present Invention (Layer (A))

The layer (A) of the present invention is an infrared transmittable colored resin layer, and concretely a colored resin layer having an absorptance of a light with a wavelength of 800-1400 nm of not more than 10%. The layer (A) can be constituted, for example, by containing a coloring agent, especially an infrared transmittable coloring agent in a resin component that constitutes the layer (A).

In the present invention, the absorptance of a light with a wavelength of 800-1400 nm of not more than 10% means that a minimum value of absorptance within a wavelength range of 800-1400 nm is not more than 10%, but does not require that the absorptance of the entire light within the wavelength range of 800-1400 nm is 10% or less. Normally, when the absorptance of a light at one wavelength of the wavelength range of 800-1400 nm is not more than 10%, it is considered that the absorptance of a light with a wavelength adjacent to it is also lowered to the same extent.

The infrared transmittable coloring agent has a property of absorbing a visible light to effect coloration and transmitting infrared radiation, and concrete examples include perylene black pigments. Such perylene black pigments are commercially available as "Paliogen Black 50084, Paliogen Black L0086, Lumogen Black FK4280 and Limogen Black FK4281 (trade name: manufactured by BASF)". Also, as the infrared transmittable coloring agent, perylene pigments described in JP-A-2007-128943 can be used. Such an infrared transmittable coloring agent can be used alone or in combination of two or more.

In addition, the infrared transmittable coloring agent can be used in combination with other coloring agents such as pigments and dyes as long as it does not impair infrared transmittability of the layer (A). As other coloring agents, known inorganic pigments, organic pigments and dyes can be used. For example, when a yellow pigment is used in combination with a perylene black pigment, a brown layer (A) can be obtained, and when a blue pigment is used in combination, a dark blue layer (A) can be obtained, and when a white pigment is used in combination, a grey layer (A) can be obtained.

Degree of coloring of the layer (A) is not particularly limited as long as it satisfies the infrared transmittability of the layer (A), but usually it only has to be colored to make the L value (brightness) of a surface on the layer (A) side of a layered product to be not more than 40, preferably not more than 35 and more preferably not more than 30. Meanwhile, a surface on the layer (A) side of the layered product means a surface of the layer (A) when none of a water vapor barrier layer (D) and a protective layer (E) is provided on the outer surface of the layer (A), a surface of the layer (D) when the water vapor barrier layer (D) is provided on the outer surface of the layer (A), and a surface of the protective layer (E) when the protective layer (E) is provided on a surface on the layer (A) side.

The content of the coloring agent (the total amount of the infrared transmittable coloring agent and other coloring agents) in the layer (A) is not particularly limited as long as it does not impair infrared ray transmittability of the layer (A), but usually 0.1-5 parts by mass is preferable, 0.1-4.5 parts by mass is more preferable, and 0.5-4.0 parts by mass is further more preferable. When the content of the coloring agent is less than 0.1 parts by mass, coloring may be insufficient, and when the content of the coloring agent exceeds 5 parts by mass, transmittability of infrared radiation may be insufficient and production cost may be increased.

A resin component constituting the layer (A) is not particularly limited, but from the viewpoint of molding processability of the layered product, a thermoplastic resin (II) is preferable. Also, the thermoplastic resin (II) preferably has a glass transition temperature lower than that of a thermoplastic resin (I) constituting the above layer (B), from a point of imparting flexibility to the layered product. The thermoplastic resin (II) preferably has the glass transition temperature of 90-200° C., more preferably 95-160° C., further more preferably 95-150° C. and particularly preferably 110-140° C. When the thermoplastic resin (II) has the glass transition temperature of higher than 200° C., flexibility of the layered product tends to be deteriorated, and on the other hand, when it is lower than 90° C., heat resistance tends to be insufficient.

Examples of the thermoplastic resin (II) include styrene resins (for example, rubber-reinforced styrene resins, acrylonitrile/styrene resins, other (co)polymers of aromatic vinyl compounds, and the like), polyolefin resins (for example, polyethylene resins, polypropylene resins, ethylene-α-olefin resins, and the like), polyvinyl chloride resins, polyvinylidene chloride resins, polyvinyl acetate resins, saturated polyester resins (for example, polyethylene terephthalate, polybutylene terephthalate, polyethylene naphthalate, polytrimethylene terephthalate, and the like), polycarbonate resins, acrylic resins (for example, (co)polymers of (meth)acrylate compounds), fluorocarbon resins, ethylene/vinyl acetate resins and the like. These can be used alone or in combination of two or more. Of these, from the viewpoint of difficulty in hydrolysis even used outside for a long time, use of styrene resin (II-1) is preferable.

The styrene resin (II-1) used in the present invention (hereinafter also referred to as "Component (II-1)") is typically a rubber-reinforced styrene resin composition (II-1-1) obtained by polymerization of a vinyl monomer (b) comprising an aromatic vinyl compound and optionally another monomer copolymerizable with the aromatic vinyl compound in the presence of a rubber-like polymer (a) and/or a (co)polymer (II-1-2) of a vinyl monomer (b). The latter (co)polymer (II-1-2) can be obtained by polymerization of a vinyl monomer (b) in the absence of the rubber-like polymer (a). The rubber-reinforced styrene resin (II-1-1) usually includes copolymers in which the above vinyl monomer (b) is graft-copolymerized onto the rubber-like polymer (a) and an ungrafted component which is made from the vinyl monomer (b) but is not grafted onto the rubber-like polymer (a) (one which is of the same type as the above (co)polymer (II-1-2)).

The Component (II-1) of the present invention preferably contains at least one kind of the rubber-reinforced styrene resin (II-1-1) from the viewpoint of impact resistance and flexibility, and may contain the (co)polymer (II-1-2), if required. The content of the rubber-like polymer (a) is preferably 5-40 parts by mass, more preferably 8-30 parts by mass, furthermore preferably 10-20 parts by mass, and particularly preferably 12-18 parts by mass relative to 100 parts by mass of Component (II-1). When the content of the rubber-like polymer (a) exceeds 40 parts by mass, heat resistance is not sufficient, and processing into a film may be difficult. On the other hand, when the content of the rubber-like polymer (a) is less than 5 parts by mass, flexibility may be insufficient.

As the rubber-like polymer (a), can be used one described above as the rubber-like polymer (i), and the preferable rubber-like polymer (a) is the same as the rubber-like polymer (i). However, in the layered product of the present invention, the rubber-like polymer (a) used in the styrene resin (II-1) may be the same as or different from the rubber-like polymer (i) used in the thermoplastic resin (I).

As the vinyl monomer (b), can be used one described above as the vinyl monomer (ii), and the preferable vinyl monomer (b) is the same as the vinyl monomer (ii). However, in the layered product of the present invention, the vinyl monomer (b) used in the styrene resin (II-1) may be the same as or different from the vinyl monomer (ii) used in the thermoplastic resin (I).

The styrene resin (II-1) preferably comprises a maleimide compound unit from the viewpoint of heat resistance. The content of the maleimide compound unit is usually preferably 0-30 mass %, more preferably 1-30 mass %, furthermore preferably 5-25 mass % and particularly preferably 10-20 mass % relative to 100 mass % of the styrene resin (II-1). Also, the maleimide compound unit may be originated from the rubber-reinforced styrene resin (II-1-1) or may be originated from the (co)polymer (II-1-2). The glass transition temperature of the styrene resin (II-1) can be adjusted by the content of the maleimide compound unit as described later, and the (co)polymer (II-1-2) containing the maleimide compound unit as a constituent monomer is advantageous for preparing a styrene resin (II-1) having a desired glass transition temperature.

According to a preferable embodiment of the present invention, as the thermoplastic resin (II), is used a rubber-reinforced styrene resin which comprises a rubber-reinforced styrene resin (II-1-1) obtained by polymerization of a vinyl monomer (b) comprising an aromatic vinyl compound in the presence of a rubber-like polymer (a) selected from the group consisting of acrylic rubbers (i-3), silicone rubbers (i-4) and silicone/acrylic composite rubbers (i-5) and optionally a (co)polymer (II-1-2) of a vinyl monomer (b). Of these, preferable are a silicone/acrylic composite rubber-reinforced styrene resin using a silicone/acrylic composite rubber (i-5) as the rubber-like polymer (b), and a mixture of a silicone rubber-reinforced styrene resin using a silicone rubber (i-4) as the rubber-like polymer (b) and an acrylic rubber-reinforced styrene resin using an acrylic rubber (i-3) as the rubber-like polymer (b), and particularly preferable is the silicone/acrylic composite rubber-reinforced styrene resin.

The styrene resin (II-1) can be obtained by known polymerization methods such as emulsion polymerization method, suspension polymerization, solution polymerization, bulk polymerization and polymerization methods in combination of these.

The graft ratio of the rubber-reinforced styrene resin (II-1-1) is preferably 20-170%, more preferably 30-170%, furthermore preferably 40-150% and particularly preferably 50-150%. When the graft ratio is too low, flexibility for a film may be insufficient. When the graft ratio is too high, viscosity of the thermoplastic resin becomes high so that a thin product may be difficult to make.

The graft ratio can be measured by the same method as mentioned about the rubber-reinforced vinyl resin (I-1).

Meanwhile, the graft ratio can be adjusted by appropriately selecting, for example, kind and amount of a chain transfer agent used in the production of the rubber-reinforced styrene resin (II-1-1), kind and amount of a polymerization initiator, method of addition and duration of addition of monomer components during polymerization, and polymerization temperature.

The limiting viscosity [η] (measured at 30° C. in methyl ethyl ketone) of the soluble matter in acetone (but acetonitrile when acrylic rubber is used) of the rubber-reinforced styrene resin (II-1-1) is preferably 0.1 to 2.5 dl/g, more preferably 0.2 to 1.5 dl/g, and furthermore preferably 0.25 to 1.2 dl/g. It is preferable that the limiting viscosity is within this range from the viewpoint of thickness accuracy of layered products.

The limiting viscosity [η] can be measured in the same manner as the rubber-reinforced vinyl resin (I-1).

The limiting viscosity [η] can be adjusted by appropriately selecting, for example, kind and amount of a chain transfer agent used in the production of the rubber-reinforced styrene resin (II-1-1), kind and amount of a polymerization initiator, method of addition and duration of addition of monomer components during polymerization, and polymerization temperature. Also, it can be adjusted by appropriately selecting and blending (co)polymers (II-1-2) different in limiting viscosity [η].

The styrene resin (II-1) may be pelletized by previously blending required amounts of the respective components, mixing the blend in a Henschel mixer or the like, and then melt-kneading it in an extruder, or may be processed into a film or sheet by directly supplying the respective components to a film forming machine or extruding machine. In this instance, antioxidants, ultraviolet absorbents, weather resistant agents, anti-aging agents, fillers, antistatic agents, flame retardants, antifogging agents, slipping agents, antibacterial agents, fungicides, tackifiers, plasticizers, coloring agents, graphite, carbon black, carbon nanotube, and the like can be added to the styrene resin (II-1) in an amount which does not impair the object of the present invention.

Colored Resin Layer of the Present Invention (Layer (C))

The layer (C) of the present invention is a light reflective colored resin layer, and concretely has a reflectance of a light with a wavelength of 400-1400 nm of not less than 50%, preferably not less than 60% and particularly preferably not less than 70%. The layer (C) can be constituted by molding a resin which is obtained by mixing a coloring agent with high brightness in a resin component constituting the layer (C). Therefore, degree of coloring of the layer (C) is not particularly limited as long as it satisfies the above reflectance, but usually it is colored so that the surface on the layer (C) side of the layered product has an L value (brightness) of about not less than 55, preferably not less than 70, more preferably not less than 80 and particularly preferably not less than 95. Meanwhile, the surface on the layer (C) side of the layered product means the surface of the layer (C) when no water vapor barrier layer (D) is provided on the outer surface of the layer (C), and the surface of the layer (D) when the water vapor barrier layer (D) is provided on the outer surface of the layer (C), regardless of a protective layer (E). One with a white front or back face is conventionally known for use as a back sheet for solar cells, but the present invention has made a layer with high brightness function as a reflective layer against an infrared radiation transmitted from the colored resin layer (A).

In the present invention, the reflectance of a light with a wavelength of 400-1400 nm of not less than 50% means that a maximum value of reflectance within a wavelength of 400-1400 nm is not less than 50%, and does not require that the reflectance of the entire light within the wavelength of 400-1400 nm is 50% or more. Normally, when the reflectance of a light at one wavelength of the wavelength range of 400-1400 nm is not less than 50%, it is considered that the reflectance of a light with a wavelength adjacent to it is also enhanced to the same extent. Since the layer (C) has a function of reflecting an infrared radiation which has been transmitted from the layer (A) and layer (B), it has a reflectance of a light with a wavelength of 800-1400 nm of preferably not less than 50%, that is, it is preferable that the maximum value of reflectance within a wavelength of 800-1400 nm is not less than 50%.

The coloring agent with high brightness which is blended in the above layer (C) is not particularly limited as long as it has a property of reflecting an infrared radiation, and usually white pigments are used. Examples of the white pigment include $ZnO$, $TiO_2$, $Al_2O_3 \cdot nH_2O$, $[ZnS+BaSO_4]$, $CaSO_4 \cdot 2H_2O$, $BaSO_4$, $CaCO_3$ and $2PbCO_3 \cdot Pb(OH)_2$. These can be used alone or in combination of two or more.

The content of a pigment in the layer (C) is not particularly limited as long as it does not impair infrared reflectivity of the layer (C), but it is preferably an amount sufficient to make the L value (brightness) of a surface on the layer (C) side of the layered product to be not less than 55, and concretely it is preferably 1-40 parts by mass, more preferably 3-40 parts by mass, furthermore preferably 5-30 parts by mass and particularly preferably 10-25 parts by mass relative to 100 parts of the resin components constituting the layer (C). When the content is less than 1 part by mass, effect of infrared reflection is not sufficient, and when it exceeds 40 parts by mass, flexibility for a film may be insufficient.

As the resin component constituting the layer (C), can be used one described above about the layer (A), and a thermoplastic resin (II) is preferable from the viewpoint of molding processability of layered products. Also, the thermoplastic resin (II) preferably has a lower glass transition temperature than the thermoplastic resin (I) constituting the layer (B), from the viewpoint of imparting flexibility to the layered product. The glass transition temperature of the thermoplastic resin (II) is preferably 90-200° C., more preferably 95-160° C., furthermore preferably 95-150° C. and particularly preferably 110-140° C. When the glass transition temperature of the thermoplastic resin (II) is higher than 200° C., flexibility of the layered product may be deteriorated, and on the other hand, when the glass transition temperature is lower than 90° C., heat resistance may tend to be insufficient. Meanwhile, all description including description of the preferable thermoplastic resin (II) described above about the layer (A) is also applied to a resin component constituting the layer (C) as it is.

According to a preferable embodiment of the present invention, as the thermoplastic resin (II) constituting the layer (C), is used a rubber-reinforced styrene resin which comprises a rubber-reinforced styrene resin (II-1-1) obtained by polymerization of a vinyl monomer (b) comprising an aromatic vinyl compound in the presence of a rubber-like polymer (a) selected from the group consisting of acrylic rubbers (i-3), silicone rubbers (i-4) and silicone/acrylic composite rubbers (i-5) and optionally a (co)polymer (II-1-2) of a vinyl monomer (b). Of these, preferable are a silicone/acrylic composite rubber-reinforced styrene resin using a silicone/acrylic composite rubber (i-5) as the rubber-like polymer (b), and a mixture of a silicone rubber-reinforced styrene resin using a silicone rubber (i-4) as the rubber-like polymer (b) and an acrylic rubber-reinforced styrene resin using an acrylic rubber (i-3) as the rubber-like polymer (b), and particularly preferable is the silicone/acrylic composite rubber-reinforced styrene resin.

Water Vapor Barrier Layer of the Present Invention (Layer (D))

In the layered product of the present invention, a water barrier layer (D) can be optionally layered on an outer surface of the above layer (A) or the above layer (C), or between the above layer (A) and the above layer (B) or the above layer (B) and the above layer (C).

Of these, the water vapor barrier layer (D) is preferably layered on an outer surface of the above layer (A) or the above layer (C). From the viewpoint of water vapor barrier property, the water vapor barrier layer (D) is preferably layered on the outer surface of the above layer (A), and from the viewpoint of adhesion to solar cells, the water vapor barrier layer (D) is preferably layered to the outer surface of the above layer (C).

The water vapor barrier layer has an effect of preventing water vapor from permeating the layered product of the present invention, and it is not particularly limited as long as it has this effect, but when it is provided on the outer surface of the above layer (A), or between the above layer (A) and the above layer (B) or the above layer (B) and the above layer (C), it is required to have infrared transmittability like the layer (B).

The total light transmittance of the water vapor barrier layer is preferably not less than 70%, more preferably not less than 80% and furthermore preferably not less than 85%. Also, haze of the water vapor barrier layer is preferably not more than 10%, more preferably not more than 7% and furthermore preferably not more than 5%. The total light transmittance and haze are measured in accordance with JIS K 7136 or JIS K 7105. The moisture permeability of the water vapor barrier layer (also referred to as water vapor permeability) as measured under a condition at a temperature of 40° C. and humidity of 90% R.H. in accordance with JIS K 7129, is preferably 3 $g/m^2 \cdot d$ or lower, more preferably 1 $g/m^2 \cdot d$ or lower, and further more preferably 0.7 $g/m^2 \cdot d$ or lower.

As the water vapor barrier layer, usually a thin film layer made of metals and/or metal oxides can be used. Examples of the metal include aluminum, and examples of the metal oxide include silicone oxide and/or aluminum oxide. The thin film layer may be formed by metal-plating or vapor-depositing the above metal or metal oxide to the above layer (A), (B) or (C).

In addition, the water vapor barrier layer can be formed by using a water vapor barrier film which comprises the above thin film layer which is previously vapor-deposited in a synthetic resin film. From the viewpoint of cost, it is preferable to use the water vapor barrier film which comprises the above thin film layer vapor-deposited on a synthetic resin film with a thickness of preferably about 5-50 μm and more preferably 10-15 μm. As such a resin film, generally can be used one which is molded from a synthetic resin without any coloring agent into a film or sheet, and it is preferably transparent or semi-transparent and more preferably transparent. As such a synthetic resin, generally polyethylene terephthalate (PET) film can be used. As such a water vapor barrier film, commercially available one can be used, and for example, "TECH-BARRIER AX (trade name)" manufactured by MITSUBISHI PLASTICS, INC., "GX film (trade name)" manufactured by TOPPAN PRINTING CO., LTD. and "ECOSYAR VE500 (trade name)" manufactured by Toyobo Co., Ltd.

The water vapor barrier film may be layered on the outer surface of the layer (A) or layer (C) after the layered product with three layers of the layers (A), (B) and (C) is obtained, or may be previously layered on the layer (A), (B) or (C) before the layered product is obtained, or may be layered at the same time as the layers (A), (B) and (C). The laminating method may be a method in which lamination is performed in accordance with dry laminating method using an adhesive agent, or a method in which lamination is performed without any adhesive agent by coextrusion at the same time when at least one of the layers (A), (B) and (C) is molded, or at the same time when the layers (A), (B) and (C) are molded. As the above adhesive agent, polyurethane adhesive agents, epoxy adhesive agents and acrylic adhesive agents can be used, and of these, polyurethane adhesive agents are preferably used.

It is preferable that the back sheet for solar cells of the present invention shows a water vapor permeability of 3 g/m²·d or lower as measured in the water vapor permeability test in accordance with JIS K 7129B at a temperature of 40° C. and humidity of 90% RH. When the water vapor permeability is higher than 3 g/m²·d, durability of solar cells may be impaired.

Structure of the Layered Product

The infrared reflective layered product of the present invention can be produced by providing the layer (B) as a base layer, laminating the infrared transmittable colored resin layer (A) onto one face of the layer (B), and laminating the infrared reflective colored resin layer (C) onto the other face.

When the layered product of the present invention comprises the water vapor barrier layer (D), the layered product has a structure in which the layer (B) is provided as a base layer, and the infrared transmittable colored resin (A) is arranged on one side of the layer (B), and the infrared ray reflective colored resin (C) is arranged on the other side of the layer (B), and the water vapor barrier layer (D) is arranged on the outer surface of the layer (A) or layer (C), or between the layer (A) and the layer (B) or the layer (B) and the layer (C). Of these, from the viewpoint of easiness of production, the water vapor barrier layer (D) is preferably provided on the outer surface of the above layer (A) or the above layer (C). As shown in FIG. 1, when a commercially available water vapor barrier film D comprising a synthetic resin film D1 and a thin film layer D2 of a metal and/or metal oxide layered thereon is used, such a commercially available water vapor barrier film D is generally inferior in weatherability, and thus it is preferably layered on the outer surface of the above layer (A). Since the layer (A) is arranged on the silicone cell S side of solar cells, the layer (D) is protected by the layers (A) to (C), and thus this arrangement is advantageous. When the synthetic resin film D1 is made of a material inferior in hydrolytic resistance like a polyethylene terephthalate (PET) film, it is preferable that the layer (D) is layered so that the thin film layer D2 faces the above layer (A) as shown in FIG. 1. This arrangement is advantageous in that the synthetic resin film D1 is protected by the thin film layer D2 from invasion of moisture from the outside. Meanwhile, in FIG. 1, S denotes the silicon cell for solar cells, A denotes the layer (A), B denotes the layer (B), C denotes the layer (C), D denotes the layer (D), D1 denotes the synthetic resin film and D2 denotes the thin film layer.

According to a preferable embodiment of the infrared reflective layered product of the present invention, in order to impart heat resistance and flexibility to the layered product as mentioned above, the layer (B) is constituted by a thermoplastic resin (I) with a glass transition temperature of not less than 120° C., and the layer (A) and the layer (C) are constituted by a thermoplastic resin (II) with a glass transition temperature lower than the thermoplastic resin (I). It is advantageous that the thermoplastic resin (II) constituting the layer (A) is the same as that of the layer (C) except the pigment to be blended. The glass transition temperature (Tg(I)) of the thermoplastic resin (I) of the layer (B) and the glass transition temperature (Tg(II)) of the thermoplastic resin (II) of the layer (A) and the layer (C) preferably satisfy the following expression (1):

$$(Tg(I)-Tg(II)) \geq 10° C. \qquad (1),$$

more preferably the following expression (1'):

$$50° C. \geq (Tg(I)-Tg(II)) \geq 10° C. \qquad (1'),$$

and furthermore preferably the following expression (1"):

$$30° C. \geq (Tg(I)-Tg(II)) \geq 15° C. \qquad (1").$$

When the glass transition temperatures of the thermoplastic resin (I) and the thermoplastic resin (II) do not satisfy the expression (1), improvement in effect of flexibility of the resulting layered product may be insufficient. When a difference between the glass transition temperature (Tg(I)) of the thermoplastic resin (I) and the glass transition temperature (Tg(II)) of the thermoplastic resin (II) exceed 50° C., the layered product tends to be difficult to produce.

The glass transition temperatures of the thermoplastic resin (I) (especially vinyl resin (I')) and the styrene resin (II-1) can be adjusted by appropriately selecting kind or amount of the rubber-like polymer (i) or (a) to be used, or kind or amount of the vinyl monomer (ii) or (b) to be used, and suitably by changing an amount of the maleimide compound. Also, the glass transition temperature can be adjusted by blending an additive or filler such as a plasticizer and an inorganic filler.

In the layered product of the present invention, both of the thermoplastic resin (I) of a layer (B) and the thermoplastic resin (II) of a layer (A) and layer (C) are preferably resin compositions which comprise a silicone/acrylic composite rubber-reinforced styrene resin obtained by polymerization of a vinyl monomer (ii), (a) in the presence of a silicone/acrylic composite rubber (i-5) and contain a maleimide compound unit, from the viewpoint of balance of weatherability, heat resistance, hydrolytic resistance and flexibility. In this case, from the viewpoint of balance of weatherability, heat resistance, hydrolytic resistance and flexibility, it is preferable that the silicone/acrylic composite rubber-reinforced styrene resin constituting the thermoplastic resin (I) of a layer (B) contains the rubber in an amount of 10-20 parts by mass relative to 100 parts by mass of the thermoplastic resin (I), and has a glass transition temperature of 150-160° C. with the content of N-phenyl maleimide unit being 15-30 mass % relative to 100 mass % of the thermoplastic resin (I) whilst the silicone/acrylic composite rubber-reinforced styrene resin constituting the thermoplastic resin (II) of a layer (A) and a layer (C) contains the rubber in an amount of 10-20 parts by mass relative to 100 parts by mass of the thermoplastic resin (II), and has a glass transition temperature of 120-140° C. with the content of N-phenyl maleimide unit being 10-20 mass % relative to 100 mass % of the thermoplastic resin (II).

The layered product of the present invention may be in a form of either sheet or film. For example, when the layered product of the present invention is a film, it can be produced by methods which can be utilized for producing a film of a thermoplastic resin, including, for example, solution cast method, melt extrusion method, coextrusion method and melt press method. The melt extrusion method is excellent for a large scale production, but the solution cast method and melt press method are also useful for the purpose of a small scale or special application or quality evaluation. In the melt extrusion method, T-die or inflation method is used. In the melt press method, calendar method is used. When the layered product of the present invention is a sheet, it can be produced by methods which can be utilized for producing a thermoplastic sheet, including, for example, coextrusion method.

T-die method has an advantage of high-speed production, and in that case, the temperature of resin during molding only has to be not less than the melting temperature and lower than the decomposition temperature of the resin, and generally an appropriate temperature is 150-250° C.

Specifications and molding conditions of molding machine for the inflation method are not limited, and conventionally known methods and conditions can be used. For example, the extruder has a caliber of 10-600 mm in diameter and a ratio L/D of 8-45 wherein D is the caliber, and L is a length L from the bottom of the hopper to the tip of cylinder. The die has a shape generally used for inflation molding, for example, has a flow geometry of a spider type, spiral type or stacking type, and has a caliber of 1-5000 mm.

As the molding machine for calendar method, for example, any of tandem-type, L-type, reversed-L-type and Z-type can be used.

Further, the layered product of the present invention can be molded, for example, by making a single-layer film by T-die or inflation molding and then subjecting it to heat or extrusion lamination, but from the viewpoint of production cost, a multi-layer T-die extruder is preferably used for molding.

The thus-obtained layered product of the present invention has a thickness of preferably 30-500 µm, more preferably 40-400 µm, and further more preferably 50-350 µm. When the thickness is too thin, the strength of the layered product is insufficient, and there is a risk of breaking the layered product in use. On the other hand, when the thickness is too thick, problems tend to arise such that the layered product becomes difficult to process, flexibility of the layered product is deteriorated, or whitening occurs at folded portions.

In the layered product of the present invention, a ratio ($H_A/H_C$) of a thickness ($H_A$) of the above layer (A) to a thickness ($H_C$) of the above layer (C) preferably satisfies $0.5 \leq H_A/H_C \leq 1.3$ and more preferably $0.75 \leq H_A/H_C \leq 1.25$. When the layered product satisfies this condition, it can be prevented from curling.

Meanwhile, as long as the water vapor barrier layer (D) has a thickness of 5-20 µm, it generates no curl or only a subtle curl that is not practically problematic when arranged either on the outer surface of the above layer (A) or the above layer (C) or either between the above layer (A) and the above layer (B) or the above layer (B) and the above layer (C).

In the layered product of the present invention, a ratio $(H_A+H_C)/H_B$ of a total thickness of the thickness ($H_A$) of the above layer (A) and the thickness ($H_C$) of the above layer (C) to a thickness ($H_B$) of the above layer (B) satisfies $0.4 \leq (H_A+H_C)/H_B \leq 2.4$. When this condition is satisfied, the layered product excellent in balance between heat resistance and flexibility can be obtained.

The thickness ($H_B$) of the layer (B) is preferably 10-200 µm and more preferably 30-150 µm. When the layer (B) is too thin, heat resistance tends to be insufficient, and when it is too thick, flexibility tends to be insufficient. Also, the thickness ($H_A$) of the layer (A) and the thickness ($H_C$) of the layer (C) are both preferably 10-150 µm and more preferably 15-100 µm. When the layers (A) and (C) are too thin, flexibility tends to be insufficient, and when they are too thick, heat resistance tends to be insufficient.

Further, for example, when the thickness of the whole layered product is 250 µm, the thicknesses of the layer (A)/the layer (B)/the layer (C) are preferably 10-100/10-200/10-200 µm, more preferably 30-100/50-190/30-100 µm, further more preferably 40-90/70-170/40-90 µm and particularly preferably 50-80/90-150/50-80 µm. When the thickness of the layer (A) exceeds 100 µm, heat resistance tends to be insufficient, and on the other hand, when the thickness of the above layer (A) is less than 10 µm, flexibility of the layered product film tends to be insufficient.

In addition, for example, when the thickness of the whole layered product with a water vapor barrier layer (D) is 250 µm, the thicknesses of the layer (A)/the layer (B)/the layer (C)/the layer (D) are preferably 10-100/10-200/10-200/10-100 µm, more preferably 30-100/50-190/30-100/5-50 µm, further more preferably 40-90/70-170/40-90/5-40 µm and particularly preferably 50-80/90-150/50-80/5-20 µm. When the thickness of the layer (A) and/or the layer (C) exceeds 100 µm, heat resistance tends to be insufficient, and on the other hand, when the thickness of the layer (A) and/or the layer (C) is less than 30 µm, flexibility of the back sheets for solar cells tends to be insufficient.

When the infrared reflective layered product of the present invention does not comprise the water vapor barrier layer (D), a protective layer (E) can be optionally layered on the outer surface of the layer (A) and/or the outer surface of the layered (C), and is preferably layered on the outer surface of the above layer (C). Particularly, when the layered product of the present invention is used as a back sheet for solar cells, it is preferable that the protective layer (E) is provided on the outer surface of the above layer (C) which is positioned at the side opposite to solar cells from the viewpoint of power generation efficiency and adhesion to the solar cells.

In addition, when the infrared reflective layered product of the present invention comprises the water vapor barrier layer (D), a protective layer (E) can be optionally layered as the outermost layer on the side of the layer (C). Particularly, when the layered product of the present invention is used as a back sheet for solar cells, it is preferable that the protective layer (E) is provided as the outermost layer on the side of the above layer (C) which is positioned at the side opposite to solar cells from the viewpoint of power generation efficiency and adhesion to the solar cells. For example, when the water vapor barrier layer (D) is provided on the outer surface of the layer (A), the protective layer (E) can be layered on the outer surface of the layer (C), and when the water vapor barrier layer (D) is provided on the outer surface of the layer (C), the protective layer (E) can be layered on the outer surface of the layer (D). Particularly, when the water vapor barrier (D) is provided on the outer surface of the layer (C), a vapor-deposited layer of the water vapor barrier layer (D) is positioned to be the outer surface, and thus the protective layer (E) layered thereon can function to protect the vapor-deposited layer, thereby improving durability of the water vapor barrier property. On the other hand, since the layer (A) is layered on a solar cell, high adhesion between the layered product and solar cells can be achieved.

The protective layer (E) is frequently used in cover films and back sheets for solar cells for improving physical properties such as scratch resistance and penetration resistance, chemical properties such as chemical resistance or thermal properties such as flame resistance, and, in the present invention, is preferably one which can improve flame resistance and scratch resistance of the layered product.

Such a protective layer (E) includes, for example, fluorocarbon resin films such as polyvinylfluoride film and ethylene-tetrafluoroethylene copolymer film, polycarbonate film, polyarylate film, polyethersulfone film, polysulfone film, polyacrylonitrile film, polyethylene terephthalate (PET) film with hydrolytic resistance, polyethylene naphthalate (PEN) film with hydrolytic resistance, cellulose acetate film, acrylic resin film, polypropylene film with weatherability, glass fiber-reinforced polyester film, glass fiber-reinforced acrylic resin film and glass fiber-reinforced polycarbonate film. Of these, as the protective layer used in the present invention, fluorocarbon resin film, polyethylene terephthalate film with hydrolytic resistance and polyethylene naphthalate film with hydrolytic resistance are preferable due to excellent flame resistance and scratch resistance. These can be used as a single film or a laminated film of two or more layers.

The thickness of the protective layer (E) is preferably 25-300 μm and more preferably 25-200 μm. When the thickness of the protective layer (E) is less than 25 μm, the effect of protecting the layered product is insufficient. When the thickness of the protective layer (E) exceeds 300 μm, flexibility of the layered product is insufficient, and also the weight of the layered product is increased, and thus this is not preferable.

Further, in the infrared reflective layered product of the present invention, the layer (A) is usually used as a surface for receiving a light such as sunlight, and thus it can be provided with a pressure sensitive adhesive layer or adhesive layer on a surface of the layer (C), (D) or (E) as the back in order to obtain a cohesive film, adhesive film, cohesive sheet or adhesive sheet. A protective layer can be further provided on a surface of a cohesive layer or adhesive layer so as to protect these layers.

If required, another layer may be layered between the respective layers of the layered product, which includes a decorative layer, and a layer made of a recycle resin (usually, the thermoplastic resin (I), the thermoplastic resin (II) and a blend of these ingredients) generated during production, as long as the effect of the present invention is not impaired.

The infrared reflective layered product of the present invention is suitably used as a back sheet for solar cells, especially a back sheet for solar cells of crystalline silicon type, as well as others including interior materials for automobiles, building materials, and colored reflective plates for infrared heaters.

A solar cell module using the back sheet for solar cells of the present invention is usually composed of a transparent substrate such as glass, a sealing film, a solar cell element, a sealing film and the back sheet for solar cells of the present invention in this order from the sunlight receiving surface side. Of these, the transparent substrate, the sealing film, the solar cell element and the sealing film constitute the solar battery silicon cell.

As the transparent substrate, generally glass is used. Since glass is excellent in transparency and weatherability but low in impact resistance and heavy, a transparent resin with weatherability is also preferably used for the solar cells placed on the roof of ordinary houses. The transparent resin includes a fluorocarbon resin film. The thickness of the transparent substrate is usually 3-5 mm when glass is used, and usually 0.2-0.6 mm when a transparent resin is used.

As the sealing film, an olefin resin is used. Here, the olefin resin collectively refers to polymers resulting from polymerization or copolymerization of an olefin such as ethylene, propylene, butadiene and isoprene or a diolefin, and includes copolymers of ethylene with another monomer such as vinyl acetate and acrylic acid esters and ionomers thereof. Concretely, it includes polyethylene, polypropylene, polymethylpentene, ethylene/vinyl chloride copolymer, ethylene/vinylacetate copolymer (EVA), ethylene/vinyl alcohol copolymer, chlorinated polyethylene and chlorinated polypropylene, and of these, EVA is widely used. EVA may be painted as a cohesive agent or adhesive agent or used in a sheet form, but generally is used in a sheet form which is heat-pressed. When it is used in a sheet form, the thickness thereof is usually 0.2-5.0 mm.

As the solar cell element, a known silicon can be used. The silicon may be amorphous silicon, monocrystalline silicon or polycrystalline silicon, and preferably polycrystalline silicon. This is due to the following reasons. Comparing a response bandwidth of solar spectrum of amorphous silicon and polycrystalline silicon, a response bandwidth of amorphous silicone is present in a visible light side, while a response bandwidth of polycrystalline silicone is present in an infrared side. Distribution of solar energy is about 3% in ultraviolet region, about 47% in visible light region, and about 50% in infrared region, and thus the energy proportion of an infrared region is large. Thus, the use of the back sheet for solar cells of the present invention having not only low heat storage but also infrared reflective property in combination with polycrystalline silicon as the solar cell element may further improve the power generation efficiency.

The above structural units of the solar cell module can be bonded together using an adhesive agent. As the adhesive agent, known adhesive agents can be used, for example, butyl rubber adhesive agents, silicone adhesive agents and EPDM adhesive agents are included.

EXAMPLE

Hereinafter, the present invention will be described in more detail by way of Examples. However, the present invention is in no way restricted to the following Examples. The units "parts" and "%" in Examples and Comparative Examples are on mass basis unless otherwise specified.

1. Evaluation Method

The measurement methods for various evaluation items in the following Examples and Comparative Examples are shown below.

1-1. Rubber Content of Thermoplastic Resins (I) and (II)

It was calculated from a composition of raw materials.

1-2. Content of N-Phenylmaleimide Unit

It was calculated from a composition of raw materials.

1-3. Glass Transition Temperature (Tg)

It was measured using differential scanning calorimeter of type DSC2910 (trade name; manufactured by TA Instruments) in accordance with JIS K 7121.

1-4. Absorptance (%) of a Light with a Wavelength of 800-1400 nm of the Layer (A) Alone A layer (A) with a thickness shown in Tables 4 to 7 was singly formed as a film with a T-die, and then a test piece thereof (50 mm×50 mm) was used to measure a transmittance and a reflectance in a range of wavelength of 800-1400 nm with V-670 (wavelength range of 200-2700 nm) manufactured by JASCO Corporation, and an absorptance was determined based on the following equation.

Absorptance (%)=100−(transmittance (%)+reflectance (%))

1-5. Reflectance (%) of a Light with a Wavelength of 400-1400 nm of the Layer (C) Alone A layer (C) with a thickness shown in Tables 4 to 7 was singly formed as a film with a T-die, and then a test piece thereof (50 mm×50 mm) was used to measure a reflectance in a range of wavelength of 400-1400 nm with V-670 (wavelength 200-2700 nm) manufactured by JASCO Corporation.

1-6. L Value

L value of a single layer was measured using a test piece of 50 mm×50 mm×100μ with an absorption spectrophotometer TCS-II manufactured by Toyo Seiki Seisaku-sho, Ltd. L value of a layered product was obtained by measuring each surface of the resulting layered product.

1-7. Heat Resistance

1-7-1. Dimensional Change (%) of a Layer (B) Alone After Heating at 150° C. for 30 min.

A layer (B) with a thickness shown in Tables 4-7 was singly formed as a film with a T-die, and then a square of 50 mm (MD)×50 mm (TD) was drawn on the center of a surface of a test piece of 100 mm (MD: extruding direction of a resin from T-die)×100 mm (TD: vertical direction to MD), and the test piece was heated and left at 150° C. for 30 minutes in a thermostatic chamber, and then taken out to measure a dimensional change of each side in MD and TD directions of the test piece. The length after heating was taken as an average of the measured values of length of the respective sides in MD and TD directions of the above square. The shrinkage(s) was determined based on the following equation from the measured dimensions before and after heating.

$$\text{Shrinkage (\%)} = \frac{\text{(Length after heating)} - \text{(Length before heating 50 mm)}}{\text{(Length before heating 50 mm)}} \times 100$$

Meanwhile, the following shrinkage(s) shows a negative value when a test piece shrinks after heating and a positive value when a test piece expands after heating.

1-7-2. Dimensional Change of the Layered Product After Heating at 150° C. for 30 min.

It was measured in the same method as above in 1-7-1 except that a layered product was used instead of the layer (B).

1-8. Flexibility (Bending Test)

A test piece of 100 mm (MD)×100 mm (TD) was cut out from a layered product, bended along an axis of symmetry in MD direction, and then along an axis of symmetry in TD direction. A manual pressing roll (2000 g) was used to make two round trips on each crease of the bended test piece at a speed of 5 mm/sec in accordance with JIS 20237. Then, the crease was unfolded to return to an original condition, and the condition of the test piece was visually observed. Criteria are shown below. In the test results, one having no crack of crease is excellent in flexibility.

⊚: No crease was cracked, and further bending and unfolding did not cause the crease to crack.
○: No crease was cracked, but further bending and unfolding caused the crease to crack.
X: A crease was cracked.

1-9. Hydrolytic Resistance (Pressure Cooker Test)

1-9-1. Retention of Fracture Stress

A test piece of 150 mm (MD)×15 mm (TD) was cut out from a layered product, and left under the condition with a temperature of 120° C. and a humidity of 100% for 100 or 200 hours, and then fracture stress of the test piece was measured in accordance with JIS K 7127 using an AG2000 tensile testing machine (manufactured by SHIMADZU CORPORATION). A distance between chucks at the time of sample setting was 100 mm and tensile rate was 300 mm/min. From the resulting measured values of fracture stress, retention of fracture stress was determined by the following equation.

$$\text{Retention of fracture stress (\%)} = \frac{\text{Fracture stress of test piece after leaving}}{\text{Fracture stress of test piece before leaving}} \times 100$$

Hydrolytic resistance was evaluated based on the obtained retention of fracture stress according to the following criteria. The higher the retention is, the better the hydrolytic resistance is.

○: retention of fracture stress exceeds 80%.
Δ: retention of fracture stress is 50-80%.
X: retention of fracture stress is less than 50%.

1-9-2. Retention of Elongation

Fracture elongation was measured simultaneously with the measurement of the above 1-9-1. Retention of elongation was determined by the following equation from the resulting measured value of elongation.

$$\text{Retention of elongation (\%)} = \frac{\text{Fracture elongation of test piece after leaving}}{\text{Fracture elongation of test piece before leaving}} \times 100$$

Hydrolytic resistance was evaluated based on the obtained retention of elongation according to the following criteria. The higher the retention is, the better the hydrolytic resistance is.
○: retention of elongation exceeds 80%.
Δ: retention of elongation is 50-80%
X: retention of elongation is less than 50%

1-9-3. Measurement of Curl (Deformation)

A test piece of 150 mm (MD)×15 mm (TD) was cut out from a layered product, and was left under the condition with a temperature of 120° C. and a humidity of 100% for 100 or 200 hours, and then curl (deformation) of the test piece was visually observed and evaluated according to the following criteria.
○: no curl (deformation).
X: there is curl (deformation).

1-10. Improvement Rate of Conversion Efficiency

In a chamber which was conditioned at a temperature of 25° C.±2° C. and humidity of 50±5% RH, a ¼ polycrystalline silicone cell which had been previously measured for its conversion efficiency was provided on the front side thereof with a glass having a thickness of 3 mm and on the back side thereof with a layered product, and then encapsulated in EVA to prepare a module, and measured for conversion efficiency using a solar simulator PEC-11 manufactured by Peccell. Meanwhile, in order to lower the effect of temperature, conversion efficiency was measured immediately after irradiation with light. Improvement rate of conversion efficiency was determined by the next equation. The higher the improvement rate of the above conversion efficiency is, the higher the power generation efficiency of solar cells is.

$$\text{Improvement rate of conversion efficiency (\%)} = \frac{(\text{conversion efficiency of module}) - (\text{conversion efficiency of cell alone})}{\text{conversion efficiency of cell alone}} \times 100$$

1-11. Heat Storage

In a chamber which was conditioned at a temperature of 25° C.±2° C. and humidity of 50±5% RH, the surface (the surface on the layer (A) side) of a test piece of 80 mm×50 mm (with a thickness shown in Tables 4-7) of a layered product was irradiated with an infrared lamp (output: 100 W) from the height of 200 mm, and a surface temperature of the test piece after 60 minutes was measured using a surface thermometer. The unit is ° C.

1-12. Weatherability

Metaling Weather Meter MV3000 (manufactured by Suga Test Instruments Co., Ltd.) was used to perform an exposure test for a test piece of 50 mm (MD)×30 mm (TD) which was cut out from a layered product, by repeating conditions of steps 1-4 shown below, and a color change value ΔE between before exposure and 100 hours after exposure was calculated. Meanwhile, the surface on the side of layer (A) of the layered product was exposed.

Step 1: irradiation 0.53 kW/m², 63° C., 50% RH, 4 h
Step 2: irradiation+raining 0.53 kW/m², 63° C., 95% RH, 1 min
Step 3: darkness 0 kW/m², 30° C., 98% RH, 4 h
Step 4: irradiation+raining 0.53 kW/m², 63° C., 95% RH, 1 min
Lab (L: brightness, a: redness, b: yellowness) was measured using Spectrophotometer V670 (manufactured by JASCO Corporation), and ΔE was calculated by the next equation.

$$\Delta E = \sqrt{[(L_1 - L_2)^2 + (a_1 - a_2)^2 + (b_1 - b_2)^2]}$$

wherein, $L_1$, $a_1$ and $b_1$ indicate values before exposure, and $L_2$, $a_2$ and $b_2$ indicate values after exposure. The smaller the ΔE value is, the smaller the color change is and the better the weatherability is. Evaluation standards are shown as follows.
○: ΔE is not more than 10.
X: ΔE exceeds 10.

1-13. Water Vapor Barrier Property (Water Vapor Permeability Test)

It was measured in accordance with JIS K 7129B under the following conditions.
Test device: PERMATRAN W3/31 (manufactured by MOCON)
Test temperature: 40° C.
Test humidity: 90% RH (practically measured humidity)
Permeation face: the layer (C) side of the layered product was arranged on water vapor side.

1-14. Flame Resistance

Using a burner for UL94 V-test, a lower end of a test piece (width: 20 mm×Length: 100 mm) suspended with shorter side at the top was fired for 5 seconds under the condition that the test piece was 10 mm away from the tip of the burner. After the completion of firing, a combustion condition of the fired part of the test piece was visually observed, and evaluated under the following standards.
○: there is no burning
X: there is burning 1-15. Scratch Resistance Using a reciprocating friction tester manufactured by Tosoku Seimitsu Kogyo Kabushiki-Kaisha, a surface of a test piece was rubbed 500 times by reciprocation with a cotton canvas cloth No. 3 under a vertical load of 500 g, and then the surface was visually observed and evaluated under the following standards.
○: no scratch is observed.
Δ: a little scratch is observed.
X: scratch is observed clearly.

2. Method for Producing a Layered Product 2-1. Materials to be Used 2-1-1. Butadiene Rubber-Reinforced Styrene Resin

[Preparation of Butadiene Graft Copolymer (a)]
In a glass reaction vessel equipped with a stirrer, 75 parts of ion-exchanged water, 0.5 part of potassium rosinate, 0.1 part of t-dodecylmercaptane, 32 parts (as solid matter) of polybutadiene latex (average particle diameter: 270 nm, gel content: 90%), 8 parts of styrene-butadiene copolymer latex (styrene content: 25%, average particle diameter: 550 nm), 15 parts of styrene and 5 parts of acrylonitrile were placed, and the mixture was heated under nitrogen stream while stirring. When the inner temperature reached 45° C., a solution of 0.2 part of sodium pyrophosphate, 0.01 part of ferrous sulfate 7-hydrate and 0.2 part of glucose in 20 parts of ion-exchanged water was added thereto. Then, 0.07 part of cumene hydroperoxide was added to initiate polymerization, and polymerization was effected for one hour. Next, 50 parts of ion-exchanged water, 0.7 part of potassium rosinate, 30 parts of styrene, 10 parts of acrylonitrile, 0.05 part of t-dodecylmercaptane and 0.01 part of cumene hydroperoxide were added continuously for 3 hours. After polymerization was effected for one hour, 0.2 part of 2,2'-methylene-bis(4-ethylene-6-t-butylphenol) was added to terminate the polymerization. Magnesium sulfate was added to the latex to coagulate resinous components. Then, the resultant was washed with water and further dried to obtain a polybutadiene graft copolymer (a). The graft ratio was 72%, and the limiting viscosity ($\eta$) of the acetone soluble matter was 0.47 dl/g.

2-1-2. Silicone/Acrylic Composite Rubber-Reinforced Styrene Resin

"METABLEN SX-006 (trade name)" manufactured by MITSUBISHI RAYON CO., LTD. (a resin modifier which is an acrylonitrile-styrene copolymer grafted onto a silicone/acrylic composite rubber with a rubber content of 50%, a graft ratio of 80%, a limiting viscosity [$\eta$] (at 30° C. in methyl ethyl ketone) of 0.38 dl/g and a glass transition temperature (Tg) of 135° C.) was used.

2-1-3. Silicone Rubber-Reinforced Styrene Resin/Acrylic Rubber-Reinforced Styrene Resin Mixture

[Preparation of Silicone Rubber-Reinforced Styrene Resin (b-1)]

1.3 parts of p-vinylphenylmethyldimethoxysilane and 98.7 parts of octamethylcyclotetrasiloxane were mixed, and placed in a solution of 2.0 parts of dodecylbenzene sulfonic acid in 300 parts of distilled water, and stirred with a homogenizer for 3 minutes to perform emulsification and dispersion. The mixture was poured into a separable flask equipped with a condenser, nitrogen introducing opening and stirrer, and heated at 90° C. for 6 hours and maintained at 5° C. for 24 hours under stirring and mixing to complete condensation. The resulting polyorganosiloxane rubber-like polymer had a condensation ratio of 93%. This latex was neutralized to pH 7 with an aqueous sodium carbonate solution. The resulting polyorganosiloxane rubber-like polymer latex had an average particle diameter of 0.3 µm.

In a glass flask having an internal volume of 7 liters and equipped with a stirrer, the ingredients for batch-polymerization comprising 100 parts of ion-exchanged water, 1.5 parts of potassium oleate, 0.01 part of potassium hydroxide, 0.1 part of t-dodecylmercaptane, 40 parts (as solid matter) of the above polyorganosiloxane latex, 15 parts of styrene and 5 parts of acrylonitrile were added thereto, and heated under stirring. When a temperature reached 45° C., an activating solution comprising 0.1 part of ethylenediaminetetraacetic acid, 0.003 part of ferrous sulfate, 0.2 part of formaldehyde sodium sulfoxylate dihydrate and 15 parts of ion-exchanged water, and 0.1 part of diisopropylbenzene hydroperoxide was added, and reaction was continued for an hour.

Then, a mixture of incremental polymerization ingredients comprising 50 parts of ion-exchanged water, 1 part of potassium oleate, 0.02 part of potassium hydroxide, 0.1 part of t-dodecylmercaptane and 0.2 part of diisopropylbenzene hydroperoxide as well as the monomers of 30 parts of styrene and 10 parts of acrylonitrile was added continuously over 3 hours to continue the reaction. After the completion of addition, reaction was further continued for an hour under stirring, and then 0.2 part of 2,2-methylene-bis-(4-ethylene-6-t-butylphenol) was added thereto to obtain a polymer latex. Further, 1.5 parts of sulfuric acid was added to the above latex and allowed to coagulate at 90° C., and dehydration, washing with water and drying were performed to obtain a silicone rubber-reinforced styrene resin (b-1) in a powder form. The graft ratio thereof was 84% and the limiting viscosity [$\eta$] (at 30° C. in methyl ethyl ketone) was 0.60 dl/g.

[Preparation of Acrylic Rubber-Reinforced Styrene Resin (b-2)]

In a reaction vessel, 50 parts (as solid matter) of a latex with a solid content of 40% of an acrylic rubber-like polymer (with a volume average particle diameter of 100 nm and a gel content of 90%) obtained by emulsion polymerization of 99 parts of n-butyl acrylate and 1 part of allylmethacrylate was placed, and further 1 part of sodium dodecylbenzene sulfonate and 150 parts of ion-exchanged water were placed for dilution. Then, the inside of the reaction vessel was purged with nitrogen, 0.02 part of ethylenediaminetetraacetic acid disodium salt, 0.005 part of ferrous sulfate and 0.3 part of sodium formaldehyde sulfoxylate were added thereto, and heated to 60° C. under stirring.

On the other hand, in a vessel, 1.0 part of terpinolene and 0.2 part of cumene hydroperoxide were dissolved in 50 parts of a mixture of 37.5 parts of styrene and 12.5 acrylonitrile, and then the inside of the vessel was purged with nitrogen to obtain a monomer composition.

Next, the above monomer composition was polymerized at 70° C. whilst it was added to the above reaction vessel at a constant flow rate over 5 hours, to obtain latex. Magnesium sulfate was added to the latex to coagulate resinous components. Then, the resultant was washed with water and further dried to obtain an acrylic rubber-reinforced styrene resin (b-2). The graft ratio thereof was 93% and the limiting viscosity [$\eta$] (at 30° C. in methyl ethyl ketone) was 0.30 dl/g.

2-1-4. Styrene-Acrylonitrile Copolymer

"SAN-H (trade name)" manufactured by Techno Polymer Co., Ltd. (AS resin).

2-1-5. N-phenylmaleimide-acrylonitrile-styrene Copolymer

"POLYIMILEX PAS1460 (trade name)" manufactured by NIPPON SHOKUBAI CO., LTD. (N-phenylmaleimide-acrylonitrile-styrene copolymer with an N-phenylmaleimide content of 40%)

2-1-6. Polyethylene Terephthalate

"NOVAPEX GM700Z (trade name)" manufactured by Mitsubishi Chemical Corporation was used. It had a glass transition temperature (Tg) of 75° C.

2-1-7. Infrared Transmittable Organic Black Pigment (Transmittable Black)

"Lumogne Black FK4280 (trade name)" manufactured by BASF

2-1-8. Carbon Black (Black)

"Carbon black #45 (trade name)" manufactured by Mitsubishi Chemical Corporation

2-1-9. Titanium Oxide (White)

"TIPAQUE CR-60-2 (trade name)" manufactured by ISHIHARA SANGYO KAISHA, LTD

2-2. Layer (A) (Infrared Transmittable Colored Resin Layer)

The components shown in Table 1 were mixed together in a Henschel mixer in a proportion shown in Table 1, and then melt-kneaded in a double-screw extruder (TEX44 manufactured by The Japan Steel Works, LTD., a barrel temperature of 270° C.) to obtain pellets. The resulting composition was evaluated in accordance with the above evaluation methods. The results are shown in Table 1.

TABLE 1

|   |   | Layer (A) | | | | | Layer (C) | | | |
|---|---|---|---|---|---|---|---|---|---|---|
|   |   | ASA-1*[1] | ASA-6*[2] | ABS-1 | ASA-9*[2] | PET-1 | ASA-2*[1] | ASA-8*[1] | ABS-2 | PET-2 |
| Thermoplastic Resin (II) | Butadiene rubber-reinforced styrene resin (part) | — | — | 40 | — | — | — | — | 40 | — |
|  | Silicone/acrylic composite rubber-reinforced styrene resin (part) | 30 | — | — | — | — | 30 | 30 | — | — |
|  | Silicone rubber-reinforced styrene resin (part) | — | 10 | — | 10 | — | — | — | — | — |
|  | Acrylic rubber-reinforced styrene resin (part) | — | 22 | — | 22 | — | — | — | — | — |
|  | Styrene-acrylonitrile copolymer (part) | 30 | 28 | 20 | 28 | — | 30 | 30 | 20 | — |
|  | N-phenylmaleimide-acrylonitrile-styrene copolymer (part) | 40 | 40 | 40 | 40 | — | 40 | 40 | 40 | — |
|  | Polyethylene terephthalate (part) | — | — | — | — | 100 | — | — | — | 100 |
| Pigment | Infrared transmittable organic black pigment (part) | 3 | 3 | 2 | — | 4 | — | — | — | — |
|  | Carbon black (part) | — | — | — | 5 | — | — | — | — | — |
|  | Titanium oxide (part) | — | — | — | — | — | 20 | 2 | 25 | 15 |
| Evaluation Result | Rubber content (%) | 15 | 15 | 16 | 15 | — | 15 | 15 | 16 | — |
|  | N-phenylmaleimide unit content (%) | 16 | 16 | 16 | 16 | — | 16 | 16 | 16 | — |
|  | Glass transition temperature (Tg) (° C.) | 135 | 135 | 135 | 135 | 75 | 135 | 135 | 135 | 75 |
|  | 100μ mono layer L value | 29 | 28 | 28 | 24 | 28 | 97 | 65 | 97 | 96 |

*[1] Silicone/acrylic composite rubber 100%.
*[2] Combined use of 26.7% silicone rubber and 73.3% acrylic rubber.

2-3. Layer (B) (Base Layer)

The components shown in Table 2 were mixed together in a Henschel mixer in a proportion shown in Table 2, and then melt-kneaded in a double-screw extruder (TEX44 manufactured by The Japan Steel Works, LTD., a barrel temperature of 270° C.) to obtain pellets. The resulting composition was evaluated in accordance with the above evaluation methods. The results are shown in Table 2.

TABLE 2

|   |   | Layer (B) | | | | | |
|---|---|---|---|---|---|---|---|
|   |   | ASA-3*[1] | ASA-4*[2] | ASA-5*[1] | ABS-3 | ASA-7*[1] | PET-3 |
| Thermoplastic Resin (I) | Butadiene rubber-reinforced styrene resin (part) | — | — | — | 40 | — | — |
|  | Silicone/acrylic composite rubber-reinforced styrene resin (part) | 30 | — | 30 | — | 30 | — |
|  | Silicone rubber-reinforced styrene resin (part) | — | 10 | — | — | — | — |
|  | Acrylic rubber-reinforced styrene resin (part) | — | 22 | — | — | — | — |
|  | Styrene-acrylonitrile copolymer (part) | 8 | 6 | 8 | — | 70 | — |
|  | N-phenylmaleimide-acrylonitrile-styrene copolymer (part) | 62 | 62 | 62 | 60 | — | — |
|  | Polyethylene terephthalate (part) | — | — | — | — | — | 100 |

TABLE 2-continued

|  |  | Layer (B) | | | | | |
|---|---|---|---|---|---|---|---|
|  |  | ASA-3*[1] | ASA-4*[2] | ASA-5*[1] | ABS-3 | ASA-7*[1] | PET-3 |
| Pigment | Titanium oxide (white) (part) | — | — | 20 | — | — | — |
| Evaluation Result | Rubber content (%) | 15 | 15 | 15 | 16 | 15 | — |
|  | N-phenylmaleimide unit content (%) | 24.8 | 24.8 | 24.8 | 24 | 0 | — |
|  | Glass transition temperature (Tg) (° C.) | 155 | 155 | 155 | 155 | 108 | 75 |
|  | 100μ mono layer L value | 56 | 57 | 97 | 56 | 56 | 43 |

*[1]Silicone/acrylic composite rubber 100%.
*[2]Combined use of 26.7% silicone rubber and 73.3% acrylic rubber.

2-4. Layer (C) (Infrared Reflective Colored Resin Layer)

The components shown in Table 1 were mixed together in a Henschel mixer in a proportion shown in Table 1, and then melt-kneaded in a double-screw extruder (TEX44 manufactured by The Japan Steel Works, LTD., a barrel temperature of 270° C.) to obtain pellets. The resulting composition was evaluated in accordance with the above evaluation methods. The results are shown in Table 1.

2-5. Layer (D) (Water Vapor Barrier Layer)

A water vapor barrier layer shown in Table 3 was used. These water vapor barrier films are those comprising a transparent polyethylene terephthalate (PET) film which is formed on one surface thereof with a transparent thin film layer made of a metal and/or metal oxide as a water vapor barrier layer. Meanwhile, in Table 3, moisture permeability, total light transmittance and haze were respectively measured in accordance with the methods described above.

TABLE 3

|  | Trade name | Thickness (μ) | Moisture permeability (g/m²·d) | Total light transmittance (%) | Haze (%) |
|---|---|---|---|---|---|
| WVB-1 | "TECHBARRIER AX" manufactured by MITSUBISHI PLASTICS, INC. | 12 | 0.15 | 89 | 4.0 |
| WVB-2 | "ECOSYAR VE500" manufactured by Toyobo Co., Ltd. | 12 | 0.5 | 90 | 2.6 |

2-6. Layer (E) (Protective Layer)

The following commercially available PET films were used.
(E-1): "LUMIRROR X10S (trade name)" manufactured by TORAY INDUSTRIES INC. with a thickness of 50 μm.
(E-2): "Melinex 238 (trade name)" manufactured by Teijin Dupont Film Japan Limited with a thickness of 75 μm.

3. Production of Layered Film

3-1. Examples I-1 to I-7, Comparative Examples I-1 to I-4

Films were produced by the following method.
First, a multi-layer film molding machine provided with T-die (die width; 1400 mm, lip distance; 0.5 mm) and three extruders with a screw diameter of 65 mm was provided, and each pellet of the above layer (A), (B) and (C) was supplied to the respective extruders as shown in Table 4 so that the resins were ejected at a melting temperature of 270° C. from the T-die to produce a soft film. Then, the soft film was brought into surface-to-surface contact with a cast roll (roll surface temperature; 95° C.) by air knife, and cooled and solidified to obtain a film. In this instance, by adjusting operation conditions of the extruders and cast roll, the thickness of the whole film and the respective thicknesses of layer (A)/layer (B)/ layer (C) were controlled to the values shown in Table 4. The evaluation results of the resulting films are shown in Tables 4.

Meanwhile, the thickness of the film was measured by cutting out a film one hour after the initiation of production of the film, and measuring a thickness at the center and each site at an interval of 10 mm from the center to both terminals in the transverse direction of the film using a thickness gage (type "ID-C1112C" manufactured by Mitutoyo Corporation), and was taken as an average value thereof. Values measured at sites within a range of 20 mm from the film terminals were omitted from the calculation of the above average value.

TABLE 4

|  |  |  | Ex. I-1 | Ex. I-2 | Ex. I-3 | Ex. I-4 | Ex. I-5 | Ex. I-6 |
|---|---|---|---|---|---|---|---|---|
| Layer constitution | Layer (A) | Material | ASA-1 | ASA-1 | ASA-1 | ASA-6 | ASA-1 | ABS-1 |
|  |  | Tg (° C.) | 135 | 135 | 135 | 135 | 135 | 135 |
|  |  | Pigment color | Transmittable black | Transmittable black | Transmittable black | Transmittable black | Transmittable black | Transmittable black |
|  |  | Thickness (μ) | 20 | 30 | 30 | 30 | 30 | 30 |
|  | Layer (B) | Material | ASA-3 | ASA-3 | ASA-4 | ASA-3 | ASA-4 | ABS-3 |
|  |  | Tg (° C.) | 155 | 155 | 155 | 155 | 155 | 155 |
|  |  | Pigment color | — | — | — | — | — | — |
|  |  | Thickness (μ) | 60 | 100 | 150 | 100 | 150 | 100 |

TABLE 4-continued

|  |  |  |  |  |  |  |  |  |
|---|---|---|---|---|---|---|---|---|
| Layer (C) | | Material | ASA-2 | ASA-2 | ASA-2 | ASA-2 | ASA-8 | ABS-2 |
| | | Tg (° C.) | 135 | 135 | 135 | 135 | 135 | 135 |
| | | Pigment color | White | White | White | White | White | White |
| | | Thickness (μ) | 60 | 100 | 150 | 100 | 100 | 100 |
| | Thickness of the whole layered product (μ) | | 140 | 230 | 330 | 230 | 280 | 230 |
| | Difference between Tg of layer (B) and Tg of layer (A) (° C.) | | 20 | 20 | 20 | 20 | 20 | 20 |
| | Difference between Tg of layer (B) and Tg of layer (C) (° C.) | | 20 | 20 | 20 | 20 | 20 | 20 |
| | Absorptance of a light with a wavelength of 800-1400 nm of layer (A) alone (%) | | 5 | 5 | 6 | 5 | 5 | 5 |
| | Reflectance of a light with a wavelength of 800-1400 nm of layer (C) alone (%) | | 75 | 87 | 90 | 86 | 55 | 85 |
| Evaluation results | L value of surface of layer (A) of layered product | | 34 | 29 | 29 | 28 | 28 | 27 |
| | L value of surface of layer (C) of layered product | | 83 | 92 | 93 | 93 | 57 | 91 |
| | Heat resistance: dimensional change after 30 min. at 150° C. of layer (B) alone | | 0.4 | 0.4 | 0.3 | 0.4 | 0.4 | 0.4 |
| | Flexibility (bending test) | | ◎ | ◎ | ◎ | ◎ | ◎ | ◎ |
| Hydrolytic resistance (pressure cooker test) | 100 hours later | Retention of fracture stress | ○ | ○ | ○ | ○ | ○ | ○ |
| | | Retention of elongation | ○ | ○ | ○ | ○ | ○ | ○ |
| | 200 hours later | Retention of fracture stress | ○ | ○ | ○ | ○ | ○ | ○ |
| | | Retention of elongation | ○ | ○ | ○ | ○ | ○ | ○ |
| | Improvement rate of conversion efficiency (%) | | 9 | 10 | 13 | 10 | 4 | 10 |
| | Heat storage (° C.) | | 51 | 52 | 53 | 52 | 53 | 55 |
| | Weatherability | | ○ | ○ | ○ | ○ | ○ | X |

|  |  |  | Ex. I-7 | Comp. Ex. I-1 | Comp. Ex. I-2 | Comp. Ex. I-3 | Comp. Ex. I-4 |
|---|---|---|---|---|---|---|---|
| Layer constitution | Layer (A) | Material | PET-1 | ASA-9 | ASA-1 | — | ASA-1 |
| | | Tg (° C.) | 75 | 135 | 135 | — | 135 |
| | | Pigment color | Transmittable black | CB | Transmittable black | — | Transmittable black |
| | | Thickness (μ) | 40 | 30 | 30 | 0 | 30 |
| | Layer (B) | Material | PET-3 | ASA-3 | — | ASA-3 | ASA-7 |
| | | Tg (° C.) | 75 | 155 | — | 155 | 108 |
| | | Pigment color | — | — | — | White | — |
| | | Thickness (μ) | 70 | 100 | 0 | 200 | 100 |
| | Layer (C) | Material | PET-2 | ASA-2 | ASA-2 | — | ASA-2 |
| | | Tg (° C.) | 75 | 135 | 135 | — | 135 |
| | | Pigment color | White | White | White | — | White |
| | | Thickness (μ) | 40 | 100 | 200 | 0 | 60 |
| | Thickness of the whole layered product (μ) | | 150 | 230 | 230 | 200 | 190 |
| | Difference between Tg of layer (B) and Tg of layer (A) (° C.) | | 0 | 20 | — | — | −27 |
| | Difference between Tg of layer (B) and Tg of layer (C) (° C.) | | 0 | 20 | — | — | −27 |
| | Absorptance of a light with a wavelength of 800-1400 nm of layer (A) alone (%) | | 7 | 88 | 6 | — | 6 |
| | Reflectance of a light with a wavelength of 800-1400 nm of layer (C) alone (%) | | 72 | 87 | 85 | — | 77 |
| Evaluation results | L value of surface of layer (A) of layered product | | 25 | 25 | 28 | — | 27 |
| | L value of surface of layer (C) of layered product | | 79 | 91 | 91 | — | 86 |
| | Heat resistance: dimensional change after 30 min. at 150° C. of layer (B) alone | | 0.4 | 0.4 | 1.4 | 0.3 | 1.5 |
| | Flexibility (bending test) | | ◎ | ◎ | ◎ | X | ◎ |
| Hydrolytic resistance (pressure cooker test) | 100 hours later | Retention of fracture stress | X | ○ | ○ | ○ | ○ |
| | | Retention of elongation | X | ○ | ○ | ○ | ○ |
| | 200 hours later | Retention of fracture stress | X | ○ | ○ | ○ | ○ |
| | | Retention of elongation | X | ○ | ○ | ○ | ○ |
| | Improvement rate of conversion efficiency (%) | | 9 | 0 | 10 | 14 | 10 |
| | Heat storage (° C.) | | 52 | 81 | 52 | 48 | 51 |
| | Weatherability | | X | ○ | ○ | ○ | ○ |

The followings are clear from Table 4. Examples I-1 to I-7 involving the layered product comprising the layer (A), layer (B) and layer (C) of the present invention were excellent in flexibility and had a surface which was made of a colored resin but was good in infrared transmittability, low in heat storage and excellent in heat resistance, and was improved in power generation efficiency. Also, Examples I-1 to I-5 involving use of a silicone/acrylic composite rubber-reinforced styrene resin or use of a mixture of a silicone rubber-reinforced styrene resin and an acrylic rubber-reinforced styrene resin for all the layers (A), (B) and (C) were further excellent in weatherability and hydrolytic resistance.

Comparative Example I-1 involving the layer (A) in which infrared absorbable carbon black was used instead of an infrared transmittable coloring agent was high in heat storage, and inferior in power generation efficiency. Comparative Example I-2 involving the layered product without the present layer (B) was inferior in heat resistance. Comparative Example I-3 involving use of the present layer (B) alone that further contained titanium oxide as a pigment was inferior in flexibility. Comparative Example I-4 in which the layer (B) did not satisfy the requirement of heat resistance according to the present invention was inferior in heat resistance.

3-2. Examples II-1 to II-7, Comparative Examples II-1 to II-5

A film was produced by the following method.

First, a multi-layer film molding machine provided with T-die (die width; 1400 mm, lip distance; 0.5 mm) and three extruders with a screw diameter of 65 mm was provided, and each pellet of the above layer (A), (B) and (C) was supplied to the respective extruders as shown in Table 5 so that the resins were ejected at a melting temperature of 270° C. from the T-die to produce a soft film. Then, the soft film was brought into surface-to-surface contact with a cast roll (roll surface temperature; 95° C.) by air knife, and cooled and solidified to obtain a film. In this instance, by adjusting operation conditions of the extruders and cast roll, the thickness of the whole film and the respective thicknesses of layer (A)/layer (B)/layer (C) were controlled to the values shown in Table 5. Then, a layer (D) formed of a film shown in Table 5 was stuck to a surface of a layer (A) of the resulting film using an adhesive agent shown in Table 5. In this instance, a thin film layer (water vapor barrier layer) of the water vapor barrier film constituting the layer (D) was layered on the layer (A) side. That is, a layered product with a structure shown in FIG. 1 was obtained. The evaluation results of the resulting film were shown in Table 5.

Meanwhile, a thickness of a film was determined in the same manner as above in item 3-1 (Examples I-1 to I-7 and Comparative Example I-1 to I-4).

TABLE 5

| | | | | Ex. II-1 | Ex. II-2 | Ex. II-3 | Ex. II-4 | Ex. II-5 | Ex. II-6 |
|---|---|---|---|---|---|---|---|---|---|
| Layer constitution | Layer (A) | | Material | ASA-1 | ASA-1 | ASA-1 | ASA-6 | ASA-1 | ABS-1 |
| | | | Tg (° C.) | 135 | 135 | 135 | 135 | 135 | 135 |
| | | | Pigment color | Trans-mittable black | Trans-mittable black | Trans-mittable black | Trans-mittable black | Trans-mittable black | Trans-mittable black |
| | | | Thickness (μ) | 20 | 30 | 30 | 30 | 30 | 30 |
| | Layer (B) | | Material | ASA-3 | ASA-3 | ASA-4 | ASA-3 | ASA-4 | ABS-3 |
| | | | Tg (° C.) | 155 | 155 | 155 | 155 | 155 | 155 |
| | | | Pigment color | — | — | — | — | — | — |
| | | | Thickness (μ) | 60 | 100 | 150 | 100 | 150 | 100 |
| | Layer (C) | | Material | ASA-2 | ASA-2 | ASA-2 | ASA-2 | ASA-8 | ABS-2 |
| | | | Tg (° C.) | 135 | 135 | 135 | 135 | 135 | 135 |
| | | | Pigment color | White | White | White | White | White | White |
| | | | Thickness (μ) | 60 | 100 | 150 | 100 | 100 | 100 |
| | Layer (D) | Film | Material | WVB-1 | WVB-1 | WVB-2 | WVB-2 | WVB-2 | WVB-1 |
| | | | Thickness (μ) | 12 | 12 | 12 | 12 | 12 | 12 |
| | | Adhesive layer | Material | Poly-urethane | Poly-urethane | Poly-urethane | Poly-urethane | Poly-urethane | Poly-urethane |
| | | | Thickness (μ) | 5 | 3 | 5 | 5 | 3 | 3 |
| | Thickness of the whole layered product (μ) | | | 157 | 245 | 347 | 247 | 295 | 245 |
| | Difference between Tg of layer (B) and Tg of layer (A) (° C.) | | | 20 | 20 | 20 | 20 | 20 | 20 |
| | Difference between Tg of layer (B) and Tg of layer (C) (° C.) | | | 20 | 20 | 20 | 20 | 20 | 20 |
| Evaluation results | Absorptance of a light with a wavelength of 800-1400 nm of layer (A) alone (%) | | | 5 | 5 | 6 | 5 | 5 | 5 |
| | Reflectance of a light with a wavelength of 400-1400 nm of layer (C) alone (%) | | | 75 | 87 | 90 | 86 | 55 | 85 |
| | L value of surface on the layer (A) side of layered product | | | 34 | 29 | 29 | 28 | 28 | 27 |
| | L value of surface on the layer (C) side of layered product | | | 83 | 92 | 93 | 93 | 57 | 91 |
| | Heat resistance: dimensional change after 30 min. at 150° C. of layer (B) alone (%) | | | 0.4 | 0.4 | 0.3 | 0.4 | 0.4 | 0.4 |
| | Flexibility (bending test) | | | ⊚ | ⊚ | ⊚ | ⊚ | ⊚ | ⊚ |
| | Hydrolytic resistance (pressure cooker test) | 100 hours later | Retention of fracture stress | ○ | ○ | ○ | ○ | ○ | ○ |
| | | | Retention of elongation | ○ | ○ | ○ | ○ | ○ | ○ |
| | | 200 hours later | Retention of fracture stress | ○ | ○ | ○ | ○ | ○ | ○ |
| | | | Retention of elongation | ○ | ○ | ○ | ○ | ○ | ○ |
| | Improvement rate of conversion efficiency (%) | | | 9 | 10 | 13 | 10 | 4 | 10 |
| | Heat storage (° C.) | | | 51 | 52 | 53 | 52 | 50 | 52 |
| | Weatherability | | | ○ | ○ | ○ | ○ | ○ | X |
| | Water vapor barrier property (permeability test: g/m² · d) | | | 0.3 | 0.2 | 0.6 | 0.5 | 0.7 | 0.3 |

| | | | | Ex. II-7 | Comp. Ex. II-1 | Comp. Ex. II-2 | Comp. Ex. II-3 | Comp. Ex. II-4 | Comp. Ex. II-5 |
|---|---|---|---|---|---|---|---|---|---|
| Layer constitution | Layer (A) | | Material | PET-1 | ASA-1 | ASA-9 | ASA-1 | — | ASA-1 |
| | | | Tg (° C.) | 75 | 135 | 135 | 135 | — | 135 |
| | | | Pigment color | Trans-mittable black | Trans-mittable black | CB | Trans-mittable black | — | Trans-mittable black |
| | | | Thickness (μ) | 40 | 30 | 30 | 30 | 0 | 30 |
| | Layer (B) | | Material | PET-3 | ASA-3 | ASA-3 | — | ASA-3 | ASA-7 |
| | | | Tg (° C.) | 75 | 155 | 155 | — | 155 | 108 |
| | | | Pigment color | — | — | — | — | White | — |
| | | | Thickness (μ) | 70 | 100 | 100 | 0 | 200 | 100 |

TABLE 5-continued

|  |  |  | Material | PET-2 | ASA-2 | ASA-2 | ASA-2 | — | ASA-2 |
|---|---|---|---|---|---|---|---|---|---|
|  | Layer (C) |  | Tg (° C.) | 75 | 135 | 135 | 135 | — | 135 |
|  |  |  | Pigment color | White | White | White | White | — | White |
|  |  |  | Thickness (μ) | 40 | 100 | 100 | 100 | 0 | 60 |
|  | Layer (D) | Film | Material | WVB-1 | — | WVB-1 | WVB-1 | WVB-2 | WVB-1 |
|  |  |  | Thickness (μ) | 12 | 0 | 12 | 12 | 12 | 12 |
|  |  | Adhesive layer | Material | Poly-urethane | — | Poly-urethane | Poly-urethane | Poly-urethane | Poly-urethane |
|  |  |  | Thickness (μ) | 3 | 0 | 5 | 3 | 3 | 5 |
|  | Thickness of the whole layered product (μ) |  |  | 165 | 230 | 247 | 245 | 215 | 207 |
|  | Difference between Tg of layer (B) and Tg of layer (A) (° C.) |  |  | 0 | 20 | 20 | — | — | −27 |
|  | Difference between Tg of layer (B) and Tg of layer (C) (° C.) |  |  | 0 | 20 | 20 | — | — | −27 |
|  | Absorptance of a light with a wavelength of 800-1400 nm of layer (A) alone (%) |  |  | 7 | 5 | 88 | 6 | — | 6 |
|  | Reflectance of a light with a wavelength of 400-1400 nm of layer (C) alone (%) |  |  | 72 | 87 | 87 | 85 | — | 77 |
| Evaluation results | L value of surface on the layer (A) side of layered product |  |  | 25 | 27 | 25 | 28 | — | 27 |
|  | L value of surface on the layer (C) side of layered product |  |  | 79 | 92 | 91 | 91 | — | 86 |
|  | Heat resistance: dimensional change after 30 min. at 150° C. of layer (B) alone (%) |  |  | 0.4 | 0.4 | 0.4 | 1.4 | 0.3 | 1.5 |
|  | Flexibility (bending test) |  |  | ⊚ | ⊚ | ⊚ | ⊚ | X | ⊚ |
|  | Hydrolytic resistance (pressure cooker test) | 100 hours later | Retention of fracture stress | X | ○ | ○ | ○ | ○ | ○ |
|  |  |  | Retention of elongation | X | ○ | ○ | ○ | ○ | ○ |
|  |  | 200 hours later | Retention of fracture stress | X | ○ | ○ | ○ | ○ | ○ |
|  |  |  | Retention of elongation | X | ○ | ○ | ○ | ○ | ○ |
|  | Improvement rate of conversion efficiency (%) |  |  | 9 | 9 | 0 | 10 | 14 | 10 |
|  | Heat storage (° C.) |  |  | 51 | 51 | 80 | 52 | 48 | 51 |
|  | Weatherability |  |  | X | ○ | ○ | ○ | ○ | ○ |
|  | Water vapor barrier property (permeability test: g/m² · d) |  |  | 0.1 | 4.3 | 0.4 | 0.3 | 0.6 | 0.5 |

The followings are clear from Table 5. Examples II-1 to II-7 involving the layered product comprising the layer (A), layer (B), layer (C) and layer (D) of the present invention had an appearance which was colored by allowing a color of the layer (A) to be seen through the layer (D), was excellent in flexibility and water vapor barrier property, good in infrared transmittability, low in heat storage and excellent in heat resistance, and was improved in power generation efficiency. Also, Examples II-1 to II-5 involving use of a silicone/acrylic composite rubber-reinforced styrene resin or use of a mixture of a silicone rubber-reinforced styrene resin and an acrylic rubber-reinforced styrene resin for all the layer (A), (B) and (C) were further excellent in weatherability and hydrolytic resistance.

Comparative Example II-1 in which the layer (D) was omitted was inferior in water vapor barrier property. Comparative Example II-2 involving use of the layer (A) in which an infrared absorbable carbon black was used instead of the infrared transmittable coloring agent was high in heat storage and inferior in power generation efficiency. Comparative Example II-3 in which the present layer (B) was omitted was inferior in heat resistance. Comparative Example II-4 involving use without the layers (A) and (C) of a white sheet alone made of the present layer (B) that further contained titanium oxide as a pigment was inferior in flexibility. Comparative Example II-5 in which the layer (B) did not satisfy the requirement of heat resistance according to the present invention was inferior in heat resistance.

3-3. Examples III-1 to III-8, Comparative Examples III-1 to III-8

A film was produced as in the same manner as above in item 3-1 (Examples I-1 to I-7 and Comparative Examples I-1 to I-4) except that each pellet of the above layers (A), (B) and (C) was supplied to each extruder of a multi-layer film molding machine as shown in Table 6-1 or Table 6-2, and evaluated. The evaluation results of the resulting film are shown in Table 6-1 or Table 6-2.

TABLE 6-1

|  |  |  | Ex. III-1 | Ex. III-2 | Ex. III-3 | Ex. III-4 |
|---|---|---|---|---|---|---|
| Layer constitution | Layer (A) | Material | ASA-1 | ASA-1 | ASA-1 | ASA-6 |
|  |  | Tg (° C.) | 135 | 135 | 135 | 135 |
|  |  | Pigment color | Transmittable black | Transmittable black | Transmittable black | Transmittable black |
|  |  | Thickness $H_A$ (μ) | 20 | 60 | 90 | 50 |
|  | Layer (B) | Material | ASA-3 | ASA-3 | ASA-4 | ASA-3 |
|  |  | Tg (° C.) | 155 | 155 | 155 | 155 |
|  |  | Pigment color | — | — | — | — |
|  |  | Thickness $H_B$ (μ) | 60 | 120 | 150 | 120 |
|  | Layer (C) | Material | ASA-2 | ASA-2 | ASA-2 | ASA-2 |
|  |  | Tg (° C.) | 135 | 135 | 135 | 135 |
|  |  | Pigment color | White | White | White | White |
|  |  | Thickness $H_C$ (μ) | 20 | 60 | 90 | 60 |

TABLE 6-1-continued

|  |  |  | | | | |
|---|---|---|---|---|---|---|
| | | Thickness of the whole layered product (μ) | 100 | 240 | 330 | 230 |
| | | Difference between Tg of layer (B) and Tg of layer (A) (° C.) | 20 | 20 | 20 | 20 |
| | | Difference between Tg of layer (B) and Tg of layer (C) (° C.) | 20 | 20 | 20 | 20 |
| | | $H_A/H_C$ | 1.00 | 1.00 | 1.00 | 0.83 |
| | | $(H_A + H_C)/H_B$ | 0.67 | 1.00 | 1.20 | 0.92 |
| Evaluation results | | Absorptance of a light with a wavelength of 800-1400 nm of layer (A) alone (%) | 5 | 5 | 7 | 6 |
| | | Reflectance of a light with a wavelength of 400-1400 nm of layer (C) alone (%) | 75 | 88 | 90 | 85 |
| | | L value of surface of layer (A) of layered product | 38 | 25 | 17 | 27 |
| | | L value of surface of layer (C) of layered product | 72 | 84 | 90 | 85 |
| | | Heat resistance: dimensional change after 30 min. at 150° C. of layer (B) alone | 0.4 | 0.3 | 0.3 | 0.3 |
| | | Heat resistance: dimensional change after 30 min. at 150° C. of layered product | 0.4 | 0.3 | 0.3 | 0.3 |
| | | Flexibility (bending test) | ◎ | ◎ | ◎ | ◎ |
| | Hydrolytic resistance (pressure cooker test) | 100 hours later Retention of fracture stress | ○ | ○ | ○ | ○ |
| | | Retention of elongation | ○ | ○ | ○ | ○ |
| | | Curl (deformation) condition | ○ | ○ | ○ | ○ |
| | | 200 hours later Retention of fracture stress | ○ | ○ | ○ | ○ |
| | | Retention of elongation | ○ | ○ | ○ | ○ |
| | | Curl (deformation) condition | ○ | ○ | ○ | ○ |
| | | Improvement rate of conversion efficiency (%) | 8 | 12 | 15 | 12 |
| | | Heat storage (° C.) | 45 | 51 | 53 | 50 |
| | | Weatherability | ○ | ○ | ○ | ○ |

|  |  |  | Ex. III-5 | Ex. III-6 | Ex. III-7 | Ex. III-8 |
|---|---|---|---|---|---|---|
| Layer constitution | Layer (A) | Material | ASA-1 | ASA-1 | ABS-1 | PET-1 |
| | | Tg (° C.) | 135 | 135 | 135 | 75 |
| | | Pigment color | Transmittable black | Transmittable black | Transmittable black | Transmittable black |
| | | Thickness $H_A$ (μ) | 40 | 120 | 60 | 50 |
| | Layer (B) | Material | ASA-4 | ASA-3 | ABS-3 | PET-3 |
| | | Tg (° C.) | 155 | 155 | 155 | 75 |
| | | Pigment color | — | — | — | — |
| | | Thickness $H_B$ (μ) | 150 | 120 | 120 | 100 |
| | Layer (C) | Material | ASA-8 | ASA-2 | ABS-2 | PET-2 |
| | | Tg (° C.) | 135 | 135 | 135 | 75 |
| | | Pigment color | White | White | White | White |
| | | Thickness $H_C$ (μ) | 50 | 120 | 60 | 50 |
| | | Thickness of the whole layered product (μ) | 240 | 360 | 240 | 200 |
| | | Difference between Tg of layer (B) and Tg of layer (A) (° C.) | 20 | 20 | 20 | 0 |
| | | Difference between Tg of layer (B) and Tg of layer (C) (° C.) | 20 | 20 | 20 | 0 |
| | | $H_A/H_C$ | 0.80 | 1.00 | 1.00 | 1.00 |
| | | $(H_A + H_C)/H_B$ | 0.60 | 2.00 | 1.00 | 1.00 |
| Evaluation results | | Absorptance of a light with a wavelength of 800-1400 nm of layer (A) alone (%) | 5 | 8 | 6 | 4 |
| | | Reflectance of a light with a wavelength of 400-1400 nm of layer (C) alone (%) | 80 | 92 | 83 | 79 |
| | | L value of surface of layer (A) of layered product | 30 | 12 | 22 | 27 |
| | | L value of surface of layer (C) of layered product | 83 | 92 | 87 | 84 |
| | | Heat resistance: dimensional change after 30 min. at 150° C. of layer (B) alone | 0.3 | 0.3 | 0.3 | 0.4 |
| | | Heat resistance: dimensional change after 30 min. at 150° C. of layered product | 0.3 | 0.3 | 0.3 | 0.4 |
| | | Flexibility (bending test) | ◎ | ◎ | ◎ | ◎ |
| | Hydrolytic resistance (pressure cooker test) | 100 hours later Retention of fracture stress | ○ | ○ | ○ | X |
| | | Retention of elongation | ○ | ○ | ○ | X |
| | | Curl (deformation) condition | ○ | ○ | ○ | ○ |
| | | 200 hours later Retention of fracture stress | ○ | ○ | ○ | X |
| | | Retention of elongation | ○ | ○ | ○ | X |
| | | Curl (deformation) condition | ○ | ○ | ○ | ○ |
| | | Improvement rate of conversion efficiency (%) | 10 | 14 | 12 | 9 |
| | | Heat storage (° C.) | 50 | 55 | 49 | 52 |
| | | Weatherability | ○ | ○ | X | X |

TABLE 6-2

|  |  |  | Comp. Ex. III-1 | Comp. Ex. III-2 | Comp. Ex. III-3 | Comp. Ex. III-4 | Comp. Ex. III-5 |
|---|---|---|---|---|---|---|---|
| Layer constitution | Layer (A) | Material | ASA-9 | ASA-1 | — | ASA-1 | ASA-1 |
|  |  | Tg (° C.) | 135 | 135 | — | 135 | 135 |
|  |  | Pigment color | CB | Transmittable black | — | Transmittable black | Transmittable black |
|  |  | Thickness $H_A$ (μ) | 60 | 70 | 0 | 60 | 40 |
|  | Layer (B) | Material | ASA-3 | — | ASA-5 | ASA-7 | ASA-3 |
|  |  | Tg (° C.) | 155 | — | 155 | 108 | 155 |
|  |  | Pigment color | — | — | White | — | — |
|  |  | Thickness $H_B$ (μ) | 120 | 0 | 150 | 120 | 120 |
|  | Layer (C) | Material | ASA-2 | ASA-2 | — | ASA-2 | ASA-2 |
|  |  | Tg (° C.) | 135 | 135 | — | 135 | 135 |
|  |  | Pigment color | White | White | — | White | White |
|  |  | Thickness $H_C$ (μ) | 60 | 80 | 0 | 60 | 120 |
|  | Thickness of the whole layered product (μ) |  | 240 | 150 | 150 | 240 | 280 |
|  | Difference between Tg of layer (B) and Tg of layer (A) (° C.) |  | 20 | — | — | −27 | 20 |
|  | Difference between Tg of layer (B) and Tg of layer (C) (° C.) |  | 20 | — | — | −27 | 20 |
|  | $H_A/H_C$ |  | 1.00 | 0.88 | — | 1.00 | 0.33 |
|  | $(H_A + H_C)/H_B$ |  | 1.00 | — | — | 1.00 | 1.33 |
| Evaluation results | Absorptance of a light with a wavelength of 800-1400 nm of layer (A) alone (%) |  | 90 | 6 | — | 5 | 4 |
|  | Reflectance of a light with a wavelength of 400-1400 nm of layer (C) alone (%) |  | 83 | 91 | — | 85 | 93 |
|  | L value of surface of layer (A) of layered product |  | 22 | 18 | — | 21 | 31 |
|  | L value of surface of layer (C) of layered product |  | 88 | 89 | — | 87 | 92 |
|  | Heat resistance: dimensional change after 30 min. at 150° C. of layer (B) alone |  | 0.3 | — | 0.3 | 1.3 | 0.3 |
|  | Heat resistance: dimensional change after 30 min. at 150° C. of layered product |  | 0.3 | 1.8 | 0.3 | 1.3 | 0.3 |
|  | Flexibility (bending test) |  | ◎ | ◎ | X | ◎ | ◎ |
| Hydrolytic resistance (pressure cooker test) | 100 hours later | Retention of fracture stress | ○ | ○ | ○ | ○ | ○ |
|  |  | Retention of elongation | ○ | ○ | ○ | ○ | ○ |
|  |  | Curl (deformation) condition | ○ | ○ | ○ | ○ | X |
|  | 200 hours later | Retention of fracture stress | ○ | ○ | ○ | ○ | ○ |
|  |  | Retention of elongation | ○ | ○ | ○ | ○ | ○ |
|  |  | Curl (deformation) condition | ○ | ○ | ○ | ○ | X |
|  | Improvement rate of conversion efficiency (%) |  | 0 | 13 | 15 | 10 | 15 |
|  | Heat storage (° C.) |  | 82 | 50 | 41 | 48 | 50 |
|  | Weatherability |  | ○ | ○ | ○ | ○ | ○ |

|  |  |  | Comp. Ex. III-6 | Comp. Ex. III-7 | Comp. Ex. III-8 |
|---|---|---|---|---|---|
| Layer constitution | Layer (A) | Material | ASA-1 | ASA-1 | ASA-1 |
|  |  | Tg (° C.) | 135 | 135 | 135 |
|  |  | Pigment color | Transmittable black | Transmittable black | Transmittable black |
|  |  | Thickness $H_A$ (μ) | 140 | 35 | 100 |
|  | Layer (B) | Material | ASA-3 | ASA-3 | ASA-3 |
|  |  | Tg (° C.) | 155 | 155 | 155 |
|  |  | Pigment color | — | — | — |
|  |  | Thickness $H_B$ (μ) | 140 | 200 | 80 |
|  | Layer (C) | Material | ASA-2 | ABS-2 | ASA-2 |
|  |  | Tg (° C.) | 135 | 135 | 135 |
|  |  | Pigment color | White | White | White |
|  |  | Thickness $H_C$ (μ) | 100 | 35 | 100 |
|  | Thickness of the whole layered product (μ) |  | 380 | 270 | 280 |
|  | Difference between Tg of layer (B) and Tg of layer (A) (° C.) |  | 20 | 20 | 20 |
|  | Difference between Tg of layer (B) and Tg of layer (C) (° C.) |  | 20 | 20 | 20 |
|  | $H_A/H_C$ |  | 1.40 | 1.00 | 1.00 |
|  | $(H_A + H_C)/H_B$ |  | 1.71 | 0.35 | 2.50 |
| Evaluation results | Absorptance of a light with a wavelength of 800-1400 nm of layer (A) alone (%) |  | 9 | 5 | 9 |
|  | Reflectance of a light with a wavelength of 400-1400 nm of layer (C) alone (%) |  | 90 | 78 | 91 |
|  | L value of surface of layer (A) of layered product |  | 12 | 35 | 12 |
|  | L value of surface of layer (C) of layered product |  | 90 | 73 | 90 |
|  | Heat resistance: dimensional change after 30 min. at 150° C. of layer (B) alone |  | 0.3 | 0.2 | 0.5 |
|  | Heat resistance: dimensional change after 30 min. at 150° C. of layered product |  | 0.3 | 0.2 | 1.2 |
|  | Flexibility (bending test) |  | ◎ | X | ◎ |
| Hydrolytic resistance | 100 hours later | Retention of fracture stress | ○ | ○ | ○ |
|  |  | Retention of elongation | ○ | ○ | ○ |

TABLE 6-2-continued

|  |  |  |  |  |  |  |
|---|---|---|---|---|---|---|
| (pressure cooker test) | 200 hours later | Curl (deformation) condition | X | ○ | ○ |
|  |  | Retention of fracture stress | ○ | ○ | ○ |
|  |  | Retention of elongation | ○ | ○ | ○ |
|  |  | Curl (deformation) condition | X | ○ | ○ |
|  | Improvement rate of conversion efficiency (%) |  | 13 | 7 | 14 |
|  | Heat storage (° C.) |  | 52 | 49 | 49 |
|  | Weatherability |  | ○ | ○ | ○ |

The followings are clear from Tables 6-1 and 6-2. Examples III-1 to III-8 involving the layered products comprising a layer (A), a layer (B) and a layer (C) of the present invention were excellent in flexibility, and were good in infrared transmittability, low in heat storage and excellent heat resistance as layered products even though their surface was made from a colored resin, and were further prevented from curling and improved in power generation efficiency. Also, Examples III-1 to III-7 involving use of rubber-reinforced styrene resins for all the layers (A), (B) and (C) were further excellent in hydrolytic resistance. Further, Examples III-1 to III-6 in which a silicone/acrylic composite rubber-reinforced styrene resin or a mixture of a silicon rubber-reinforced styrene resin and an acrylic rubber-reinforced styrene resin was used for all the layers (A), (B) and (C) were further excellent in weatherability.

Comparative Example III-1 involving use of an infrared absorbable carbon black instead of the infrared transmittable coloring agent in the layer (A) was high in light absorptance in a wavelength of 800-1400 nm of the layer (A) alone and inferior in heat storage and power generation efficiency. Comparative Example III-2 in which the present layer (B) was omitted was large in dimensional change (%) of the layered product at 150° C. for 30 minutes, and inferior in heat resistance of the layered product. Comparative Example III-3 involving use of a layer (B) alone which further contained titanium oxide as a pigment was inferior in flexibility. Comparative Example III-4 involving use of a layer (B) which does not satisfy the requirement for heat resistance of the present invention was large in dimensional change (%) of the layer (B) alone at 150° C. for 30 minutes, and inferior in heat resistance of the layered product. Comparative Examples III-5 and III-6, in which a ratio ($H_A/H_C$) of a thickness ($H_A$) of the layer (A) to a thickness ($H_C$) of the layer (C) was out of the inventive preferable range, caused curling. Comparative Examples III-7 and III-8, in which a ratio (($H_A+H_C$)/$H_B$) of the total of a thickness ($H_A$) of the layer (A) and a thickness ($H_C$) of the layer (C) to a thickness ($H_B$) of the layer (B) was out of the inventive preferable range, were inferior in either flexibility or heat resistance of the layered product.

3-4. Examples IV-1 to IV-8, Comparative Examples IV-1 to IV-9

A film was produced as in the same manner as above in item 3-2 (Examples II-1 to II-7 and Comparative Examples II-1 to II-4) except that each pellet of the above layers (A), (B) and (C) was supplied to each extruder of a multi-layer film molding machine as shown in Table 7-1 or Table 7-2, and evaluated. The evaluation results of the resulting film are shown in Table 7-1 or Table 7-2.

TABLE 7-1

|  |  |  |  | Ex. IV-1 | Ex. IV-2 | Ex. IV-3 | Ex. IV-4 |
|---|---|---|---|---|---|---|---|
| Layer constitution | Layer (A) |  | Material | ASA-1 | ASA-1 | ASA-1 | ASA-6 |
|  |  |  | Tg (° C.) | 135 | 135 | 135 | 135 |
|  |  |  | Pigment color | Transmittable black | Transmittable black | Transmittable black | Transmittable black |
|  |  |  | Thickness $H_A$ (μ) | 20 | 60 | 90 | 50 |
|  | Layer (B) |  | Material | ASA-3 | ASA-3 | ASA-4 | ASA-3 |
|  |  |  | Tg (° C.) | 155 | 155 | 155 | 155 |
|  |  |  | Pigment color | — | — | — | — |
|  |  |  | Thickness $H_B$ (μ) | 60 | 120 | 150 | 120 |
|  | Layer (C) |  | Material | ASA-2 | ASA-2 | ASA-2 | ASA-2 |
|  |  |  | Tg (° C.) | 135 | 135 | 135 | 135 |
|  |  |  | Pigment color | White | White | White | White |
|  |  |  | Thickness $H_C$ (μ) | 20 | 60 | 90 | 60 |
|  | Layer (D) | Film | Material | WVB-1 | WVB-1 | WVB-2 | WVB-2 |
|  |  |  | Thickness (μ) | 12 | 12 | 12 | 12 |
|  |  | Adhesive layer | Material | Polyurethane | Polyurethane | Polyurethane | Polyurethane |
|  |  |  | Thickness (μ) | 5 | 3 | 5 | 5 |
|  | Thickness of the whole layered product (μ) |  |  | 117 | 255 | 347 | 247 |
|  | Difference between Tg of layer (B) and Tg of layer (A) (° C.) |  |  | 20 | 20 | 20 | 20 |
|  | Difference between Tg of layer (B) and Tg of layer (C) (° C.) |  |  | 20 | 20 | 20 | 20 |
|  | $H_A/H_C$ |  |  | 1.00 | 1.00 | 1.00 | 0.83 |
|  | ($H_A + H_C$)/$H_B$ |  |  | 0.67 | 1.00 | 1.20 | 0.92 |
| Evaluation | Absorptance of a light with a wavelength of 800-1400 nm of layer (A) alone (%) |  |  | 5 | 5 | 7 | 6 |
|  | Reflectance of a light with a wavelength of 400-1400 nm of layer (C) alone (%) |  |  | 75 | 88 | 90 | 85 |
|  | L value of surface of layer (A) of layered product |  |  | 38 | 25 | 17 | 27 |
|  | L value of surface of layer (C) of layered product |  |  | 72 | 84 | 90 | 85 |
|  | Heat resistance: dimensional change after 30 min. at 150° C. of layer (B) alone (%) |  |  | 0.4 | 0.3 | 0.3 | 0.3 |

TABLE 7-1-continued

|  |  |  | | | | |
|---|---|---|---|---|---|---|
|  |  | Heat resistance: dimensional change after 30 min. at 150° C. of layered product (%) | 0.4 | 0.3 | 0.3 | 0.3 |
|  |  | Flexibility (bending test) | ⊚ | ⊚ | ⊚ | ⊚ |
| Hydrolytic resistance (pressure cooker test) | 100 hours later | Retention of fracture stress | ◯ | ◯ | ◯ | ◯ |
|  |  | Retention of elongation | ◯ | ◯ | ◯ | ◯ |
|  |  | Curl (deformation) condition | ◯ | ◯ | ◯ | ◯ |
|  | 200 hours later | Retention of fracture stress | ◯ | ◯ | ◯ | ◯ |
|  |  | Retention of elongation | ◯ | ◯ | ◯ | ◯ |
|  |  | Curl (deformation) condition | ◯ | ◯ | ◯ | ◯ |
|  |  | Improvement rate of conversion efficiency (%) | 8 | 12 | 15 | 12 |
|  |  | Heat storage (° C.) | 45 | 51 | 53 | 50 |
|  |  | Weatherability | ◯ | ◯ | ◯ | ◯ |
|  |  | Water vapor barrier property (permeability test: g/m² · d) | 0.5 | 0.3 | 0.3 | 0.4 |

|  |  |  |  | Ex. IV-5 | Ex. IV-6 | Ex. IV-7 | Ex. IV-8 |
|---|---|---|---|---|---|---|---|
| Layer constitution | Layer (A) |  | Material | ASA-1 | ASA-1 | ABS-1 | PET-1 |
|  |  |  | Tg (° C.) | 135 | 135 | 135 | 75 |
|  |  |  | Pigment color | Transmittable black | Transmittable black | Transmittable black | Transmittable black |
|  |  |  | Thickness $H_A$ (μ) | 40 | 120 | 60 | 50 |
|  | Layer (B) |  | Material | ASA-4 | ASA-3 | ABS-3 | PET-3 |
|  |  |  | Tg (° C.) | 155 | 155 | 155 | 75 |
|  |  |  | Pigment color | — | — | — | — |
|  |  |  | Thickness $H_B$ (μ) | 150 | 120 | 120 | 100 |
|  | Layer (C) |  | Material | ASA-8 | ASA-2 | ABS-2 | PET-2 |
|  |  |  | Tg (° C.) | 135 | 135 | 135 | 75 |
|  |  |  | Pigment color | White | White | White | White |
|  |  |  | Thickness $H_C$ (μ) | 50 | 120 | 60 | 50 |
|  | Layer (D) | Film | Material | WVB-2 | WVB-2 | WVB-1 | WVB-1 |
|  |  |  | Thickness (μ) | 12 | 12 | 12 | 12 |
|  |  | Adhesive layer | Material | Polyurethane | Polyurethane | Polyurethane | Polyurethane |
|  |  |  | Thickness (μ) | 3 | 5 | 3 | 3 |
|  |  |  | Thickness of the whole layered product (μ) | 255 | 377 | 255 | 215 |
|  |  |  | Difference between Tg of layer (B) and Tg of layer (A) (° C.) | 20 | 20 | 20 | 0 |
|  |  |  | Difference between Tg of layer (B) and Tg of layer (C) (° C.) | 20 | 20 | 20 | 0 |
|  |  |  | $H_A/H_C$ | 0.80 | 1.00 | 1.00 | 1.00 |
|  |  |  | $(H_A + H_C)/H_B$ | 0.60 | 2.00 | 1.00 | 1.00 |
| Evaluation |  |  | Absorptance of a light with a wavelength of 800-1400 nm of layer (A) alone (%) | 5 | 8 | 6 | 4 |
|  |  |  | Reflectance of a light with a wavelength of 400-1400 nm of layer (C) alone (%) | 80 | 92 | 83 | 79 |
|  |  |  | L value of surface of layer (A) of layered product | 30 | 12 | 22 | 27 |
|  |  |  | L value of surface of layer (C) of layered product | 83 | 92 | 87 | 84 |
|  |  |  | Heat resistance: dimensional change after 30 min. at 150° C. of layer (B) alone (%) | 0.3 | 0.3 | 0.3 | 0.4 |
|  |  |  | Heat resistance: dimensional change after 30 min. at 150° C. of layered product (%) | 0.3 | 0.3 | 0.3 | 0.4 |
|  |  |  | Flexibility (bending test) | ⊚ | ⊚ | ⊚ | ⊚ |
| Hydrolytic resistance (pressure cooker test) | 100 hours later | Retention of fracture stress |  | ◯ | ◯ | ◯ | X |
|  |  | Retention of elongation | ◯ | ◯ | ◯ | X |
|  |  | Curl (deformation) condition | ◯ | ◯ | ◯ | ◯ |
|  | 200 hours later | Retention of fracture stress | ◯ | ◯ | ◯ | X |
|  |  | Retention of elongation | ◯ | ◯ | ◯ | X |
|  |  | Curl (deformation) condition | ◯ | ◯ | ◯ | ◯ |
|  |  | Improvement rate of conversion efficiency (%) | 10 | 14 | 12 | 9 |
|  |  | Heat storage (° C.) | 50 | 55 | 49 | 52 |
|  |  | Weatherability | ◯ | ◯ | X | X |
|  |  | Water vapor barrier property (permeability test: g/m² · d) | 0.4 | 0.4 | 0.3 | 0.3 |

TABLE 7-2

|  |  |  |  | Comp. Ex. IV-1 | Comp. Ex. IV-2 | Comp. Ex. IV-3 | Comp. Ex. IV-4 | Comp. Ex. IV-5 |
|---|---|---|---|---|---|---|---|---|
| Layer constitution | Layer (A) |  | Material | ASA-1 | ASA-9 | ASA-1 | — | ASA-1 |
|  |  |  | Tg (° C.) | 135 | 135 | 135 | — | 135 |
|  |  |  | Pigment color | Transmittable black | CB | Transmittable black | — | Transmittable black |
|  |  |  | Thickness $H_A$ (μ) | 60 | 60 | 70 | 0 | 60 |
|  | Layer (B) |  | Material | ASA-3 | ASA-3 | — | ASA-5 | ASA-7 |
|  |  |  | Tg (° C.) | 155 | 155 | — | 155 | 108 |
|  |  |  | Pigment color | — | — | — | White | — |
|  |  |  | Thickness $H_B$ (μ) | 120 | 120 | 0 | 150 | 120 |

TABLE 7-2-continued

|  |  |  |  |  |  |  |  |
|---|---|---|---|---|---|---|---|
| | Layer (C) | Material | ASA-2 | ASA-2 | ASA-2 | — | ASA-2 |
| | | Tg (°C.) | 135 | 135 | 135 | — | 135 |
| | | Pigment color | White | White | White | — | White |
| | | Thickness $H_C$ (μ) | 60 | 60 | 80 | 0 | 60 |
| | Layer (D) Film | Material | — | WVB-1 | WVB-1 | WVB-2 | WVB-1 |
| | | Thickness (μ) | 0 | 12 | 12 | 12 | 12 |
| | Adhesive layer | Material | — | Polyurethane | Polyurethane | Polyurethane | Polyurethane |
| | | Thickness (μ) | 0 | 5 | 3 | 3 | 5 |
| | Thickness of the whole layered product (μ) | | 240 | 257 | 165 | 165 | 257 |
| | Difference between Tg of layer (B) and Tg of layer (A) (°C.) | | 20 | 20 | — | — | −27 |
| | Difference between Tg of layer (B) and Tg of layer (C) (°C.) | | 20 | 20 | — | — | −27 |
| | $H_A/H_C$ | | 1.00 | 1.00 | 0.88 | — | 1.00 |
| | $(H_A + H_C)/H_B$ | | 1.00 | 1.00 | — | — | 1.00 |
| Evaluation results | Absorptance of a light with a wavelength of 800–1400 nm of layer (A) alone (%) | | 6 | 90 | 6 | — | 5 |
| | Reflectance of a light with a wavelength of 400–1400 nm of layer (C) alone (%) | | 82 | 83 | 91 | — | 85 |
| | L value of surface of layer (A) of layered product | | 21 | 22 | 18 | — | 21 |
| | L value of surface of layer (C) of layered product | | 87 | 88 | 89 | — | 87 |
| | Heat resistance: dimensional change after 30 min. at 150°C. of layer (B) alone (%) | | 0.3 | 0.3 | — | 0.3 | 1.3 |
| | Heat resistance: dimensional change after 30 min. at 150°C. of layered product (%) | | 0.3 | 0.3 | 1.8 | 0.3 | 1.3 |
| | Flexibility (bending test) | | ◎ | ◎ | ◎ | X | ◎ |
| Hydrolytic resistance (pressure cooker test) | 100 hours later | Retention of fracture stress | ○ | ○ | ○ | ○ | ○ |
| | | Retention of elongation | ○ | ○ | ○ | ○ | ○ |
| | | Curl (deformation) condition | ○ | ○ | ○ | ○ | ○ |
| | 200 hours later | Retention of fracture stress | ○ | ○ | ○ | ○ | ○ |
| | | Retention of elongation | ○ | ○ | ○ | ○ | ○ |
| | | Curl (deformation) condition | ○ | ○ | ○ | ○ | ○ |
| | Improvement rate of conversion efficiency (%) | | 11 | 0 | 13 | 15 | 10 |
| | Heat storage (°C.) | | 50 | 82 | 50 | 41 | 48 |
| | Weatherability | | ○ | ○ | ○ | ○ | ○ |
| | Water vapor barrier property (permeability test: g/m²·d) | | 41 | 0.4 | 0.3 | 0.3 | 0.4 |

|  |  |  | Comp. Ex. IV-6 | Comp. Ex. IV-7 | Comp. Ex. IV-8 | Comp. Ex. IV-9 |
|---|---|---|---|---|---|---|
| Layer constitution | Layer (A) | Material | ASA-1 | ASA-1 | ASA-1 | ASA-1 |
| | | Tg (°C.) | 135 | 135 | 135 | 135 |
| | | Pigment color | Transmittable black | Transmittable black | Transmittable black | Transmittable black |
| | | Thickness $H_A$ (μ) | 40 | 140 | 35 | 100 |
| | Layer (B) | Material | ASA-3 | ASA-3 | ASA-3 | ASA-3 |
| | | Tg (°C.) | 155 | 155 | 155 | 155 |
| | | Pigment color | — | — | — | — |
| | | Thickness $H_B$ (μ) | 120 | 140 | 200 | 80 |
| | Layer (C) | Material | ASA-2 | ASA-2 | ASA-2 | ASA-2 |
| | | Tg (°C.) | 135 | 135 | 135 | 135 |
| | | Pigment color | White | White | White | White |
| | | Thickness $H_C$ (μ) | 120 | 100 | 35 | 100 |
| | Layer (D) Film | Material | WVB-1 | WVB-1 | WVB-2 | WVB-1 |
| | | Thickness (μ) | 12 | 12 | 12 | 12 |
| | Adhesive layer | Material | Polyurethane | Polyurethane | Polyurethane | Polyurethane |
| | | Thickness (μ) | 5 | 3 | 3 | 5 |
| | Thickness of the whole layered product (μ) | | 297 | 395 | 285 | 297 |
| | Difference between Tg of layer (B) and Tg of layer (A) (°C.) | | 20 | 20 | 20 | 20 |
| | Difference between Tg of layer (B) and Tg of layer (C) (°C.) | | 20 | 20 | 20 | 20 |
| | $H_A/H_C$ | | 0.33 | 1.40 | 1.00 | 1.00 |
| | $(H_A + H_C)/H_B$ | | 1.33 | 1.71 | 0.35 | 2.50 |
| Evaluation results | Absorptance of a light with a wavelength of 800–1400 nm of layer (A) alone (%) | | 4 | 9 | 5 | 9 |
| | Reflectance of a light with a wavelength of 400–1400 nm of layer (C) alone (%) | | 93 | 90 | 78 | 91 |
| | L value of surface of layer (A) of layered product | | 31 | 12 | 35 | 12 |
| | L value of surface of layer (C) of layered product | | 92 | 90 | 73 | 90 |
| | Heat resistance: dimensional change after 30 min. at 150°C. of layer (B) alone (%) | | 0.3 | 0.3 | 0.2 | 0.5 |
| | Heat resistance: dimensional change after 30 min. at 150°C. of layered product (%) | | 0.3 | 0.3 | 0.2 | 1.2 |
| | Flexibility (bending test) | | ◎ | ◎ | X | ◎ |
| Hydrolytic resistance | 100 hours later | Retention of fracture stress | ○ | ○ | ○ | ○ |
| | | Retention of elongation | ○ | ○ | ○ | ○ |

TABLE 7-2-continued

|  |  |  |  |  |  |  |
|---|---|---|---|---|---|---|
| (pressure cooker test) | 200 hours later | Curl (deformation) condition | X | X | ○ | ○ |
|  |  | Retention of fracture stress | ○ | ○ | ○ | ○ |
|  |  | Retention of elongation | ○ | ○ | ○ | ○ |
|  |  | Curl (deformation) condition | X | X | ○ | ○ |
|  | Improvement rate of conversion efficiency (%) |  | 15 | 13 | 7 | 14 |
|  | Heat storage (° C.) |  | 50 | 52 | 49 | 49 |
|  | Weatherability |  | ○ | ○ | ○ | ○ |
|  | Water vapor barrier property (permeability test: g/m² · d) |  | 0.3 | 0.3 | 0.3 | 0.4 |

The followings are clear from Tables 7-1 and 7-2. Examples IV-1 to IV-8 involving the layered products comprising a layer (A), a layer (B), a layer (C) and a layer (D) of the present invention had an appearance which was colored by allowing a color of the layer (A) to be seen through the layer (D), were excellent in flexibility and water vapor barrier property, good in infrared transmittability, low in heat storage and excellent in heat resistance as a layered product, and were prevented from curling and improved in power generation efficiency. Also, Examples IV-1 to IV-7 involving use of rubber-reinforced styrene resins for all the layer (A), (B) and (C) were further excellent in hydrolytic resistance. Further, Examples IV-1 to IV-6 in which a silicone/acrylic composite rubber-reinforced styrene resin or a mixture of a silicon rubber-reinforced styrene resin and an acrylic rubber-reinforced styrene resin was used for all the layers (A), (B) and (C) were further excellent in weatherability.

Comparative Example IV-1 was an example in which the layer (D) was omitted, and was inferior in water vapor barrier property. Comparative Example IV-2 involving use of an infrared absorbable carbon black instead of the infrared transmittable coloring agent in a layer (A) was high in light absorptance in a wavelength of 800-1400 nm of the layer (A) alone, and was inferior in heat storage and power generation efficiency. Comparative Example IV-3 in which the layer (B) of the present invention was omitted was large in dimensional change (%) of the layered product at 150° C. for 30 minutes, and inferior in heat resistance of the layered product. Comparative Example IV-4 involving use without the layers (A) and (C) of a layer (B) alone which was a white sheet further containing titanium oxide as a pigment was inferior in flexibility. Comparative Example IV-5 involving a layer (B) which did not satisfy the requirement for heat resistance of the present invention was large in dimensional change (%) of the layer (B) alone at 150° C. for 30 minutes, and inferior in heat resistance of the layered product. Comparative Examples IV-6 and IV-7, in which a ratio ($H_A/H_C$) of a thickness ($H_A$) of the layer (A) to a thickness ($H_C$) of the layer (C) was out of the inventive preferable range, caused curling. Comparative Examples IV-8 and IV-9, in which a ratio (($H_A+H_C$)/$H_B$) of the total of a thickness ($H_A$) of the layer (A) and a thickness ($H_C$) of the layer (C) to a thickness ($H_B$) of the layer (B) was out of the inventive preferable range, were inferior in either flexibility or heat resistance of the layered product.

3-5. Examples I-8 and I-9

A PET film of Table 8 was stuck on the outer surface of the layer (C) of the film obtained in Example I-2 using a polyurethane adhesive agent (painting thickness: 8 μm). Using the resulting film and the film obtained in Example I-2 as test pieces, flame resistance and scratch resistance were evaluated in accordance with the above methods. The results are shown in Table 8.

TABLE 8

|  | Example I-2 | Example I-8 | Example I-9 |
|---|---|---|---|
| Material of the protective layer (E) | none | (E-1) | (E-2) |
| Scratch resistance | Δ | ○ | ○ |
| Flame resistance | X | ○ | ○ |

From Table 8, it is found that scratch resistance and flame resistance are imparted by laminating a protective layer on the layered product of the present invention, and this is preferable.

3-6. Example II-8

A film was produced in the same manner as in Example II-2 except that a water vapor barrier layer (D) was layered on the outer surface of the layer (C). In this instance, the layer (D) was layered so that the thin film layer (water vapor barrier layer) of the water vapor barrier film constituting the layer (D) was positioned to form the outermost surface. That is, the layered product with a structure shown in FIG. 2 was obtained.

Using the resulting film and the film obtained in Example II-2 as test pieces, flame resistance and scratch resistance were evaluated in accordance with the above methods. The results are shown in Table 9.

3-7. Example II-9

A PET film of Table 9 was stuck as the protective layer (E) on the outer surface of the layer (C) of the film obtained in Example II-2 using a polyurethane adhesive agent (painting thickness: 8 μm). That is, the layered product with a structure shown in FIG. 3 was obtained.

Using the resulting film as a test piece, flame resistance and scratch resistance were evaluated in accordance with the above methods. The results are shown in Table 9.

3-8. Example II-10

A PET film of Table 9 was stuck as the protective layer (E) on the outer surface of the layer (D) of the film obtained in Example II-8 using a polyurethane adhesive agent (painting thickness: 8 μm). That is, the layered product with a structure shown in FIG. 4 was obtained.

Using the resulting film as a test piece, flame resistance and scratch resistance were evaluated in accordance with the above methods. The results are shown in Table 9.

TABLE 9

| | Example II-2 | Example II-8 | Example II-9 | Example II-10 |
|---|---|---|---|---|
| Material of the protective layer (E) | none | none | (E-1) | (E-1) |
| Scratch resistance | Δ | Δ | ◯ | ◯ |
| Flame resistance | X | X | ◯ | ◯ |

From Table 9, it is found that scratch resistance and flame resistance are improved by laminating a protective layer (E) of the present invention on the outer surface of the layer (C), and this is preferable.

INDUSTRIAL APPLICABILITY

The infrared reflective layered product of the present invention has a colored resin surface, has a property of reflecting an infrared radiation to prevent heat storage, and is excellent in heat resistance, and further can be one excellent in weatherability, hydrolytic resistance and flexibility, and furthermore can have an excellent water vapor barrier and/or can be prevented from curing. Thus, it can be utilized as a back sheet for solar cells used under severe environment exposed to sunlight, as well as a material of parts which require infrared reflectivity under severe environment at high temperature.

DESCRIPTION OF SYMBOLS

Figure 1:
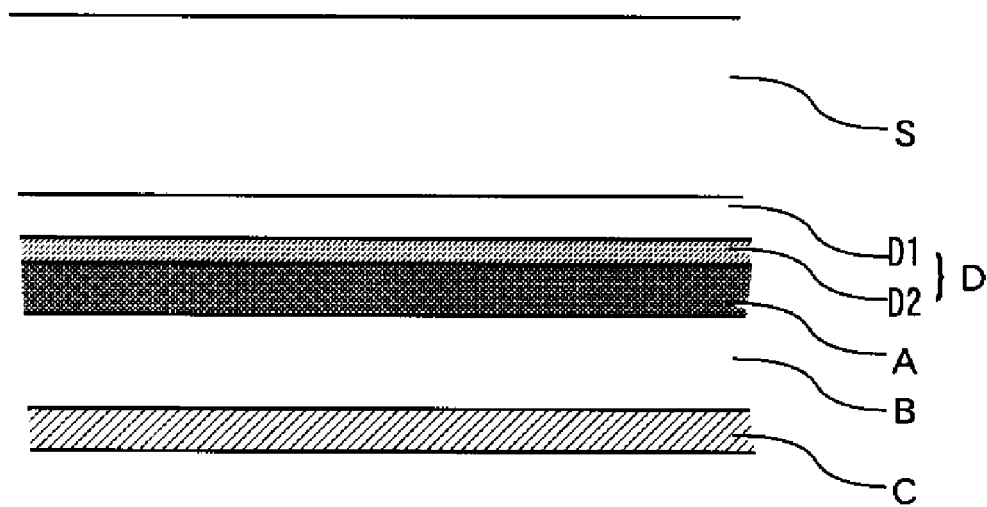
FIG. 1 is a cross sectional view showing a preferable embodiment of the layered product of the present invention.
Figure 2:
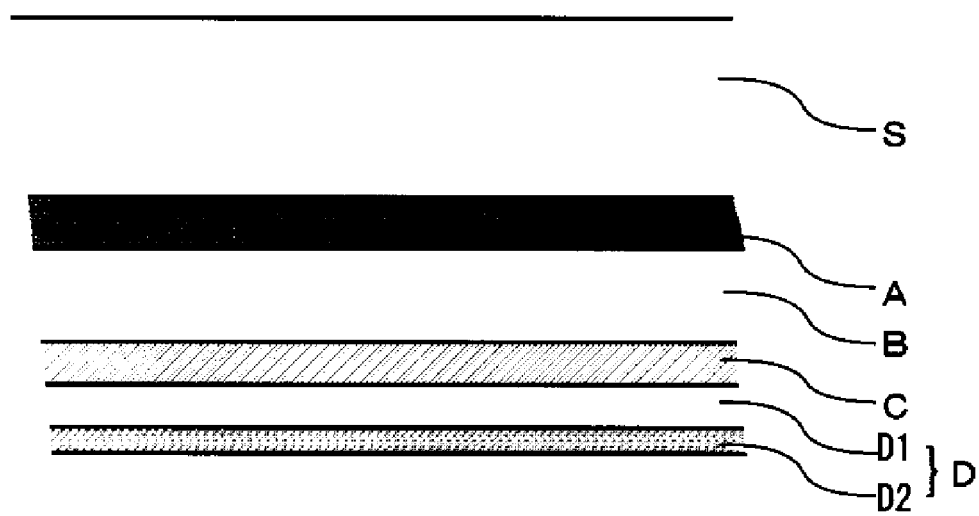
FIG. 2 is a cross sectional view showing another preferable embodiment of the layered product of the present invention.
Figure 3:
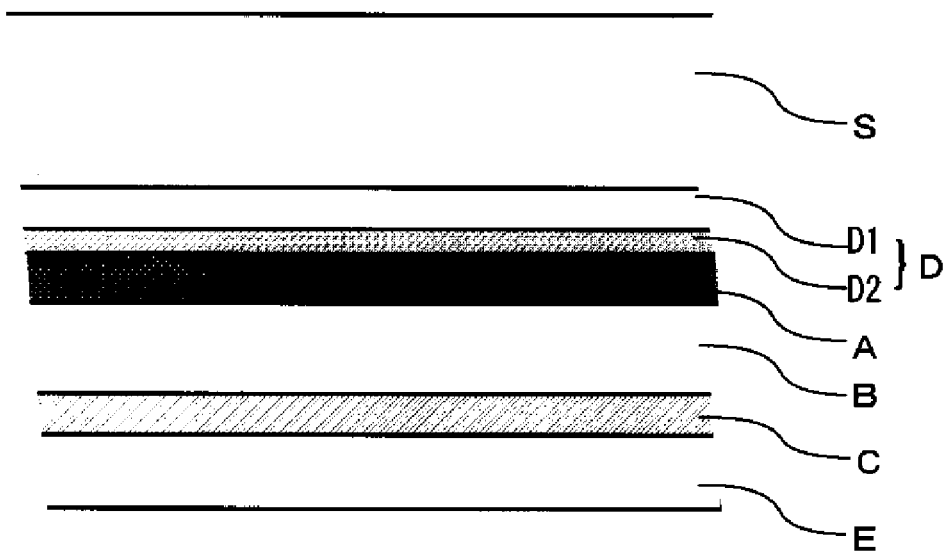
FIG. 3 is a cross sectional view showing the embodiment of FIG. 1, provided with a protective layer.
Figure 4:
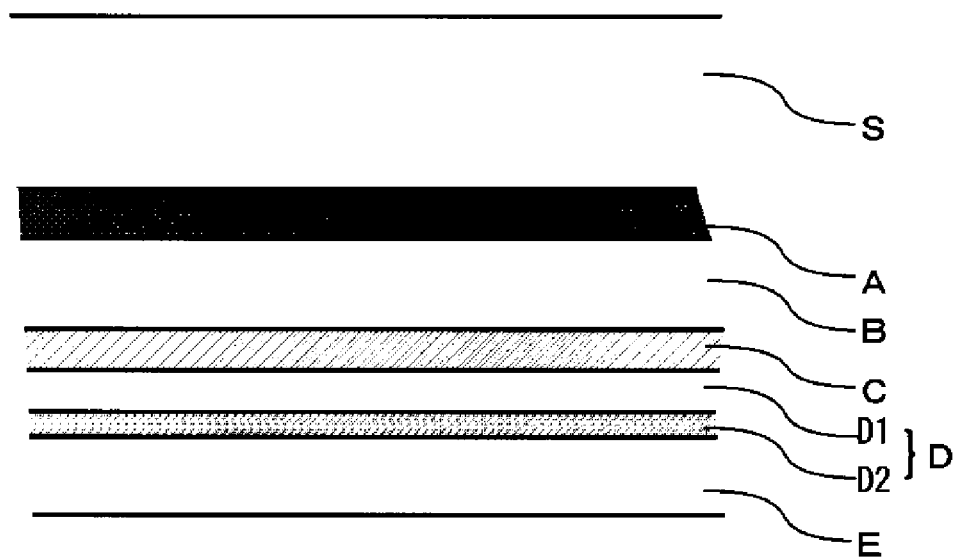
FIG. 4 is a cross sectional view showing the embodiment of FIG. 2, provided with a protective layer.

A: Layer (A), B: Layer (B), C: Layer (C), D: Layer (D), E: Layer (E), D1: Synthetic resin film, D2: Thin film layer, S: Solar battery silicon cell

The invention claimed is:

1. An infrared reflective layered product comprises;
a layer (B) as a base layer;
a layer (A) layered on one side of the layer (B); and
a layer (C) as a light reflecting layer that is layered on the other side of the layer (B), wherein
the layer (A) is a colored resin layer having an absorbance of a light with a wavelength of 800-1400 nm of not more than 10%,
the layer (B) is an infrared transmittable thermoplastic resin layer which shows a dimensional change (s) satisfying $1\% \geq s \geq -1\%$ when left at 150° C. for 30 minutes,
the layer (C) is a colored resin layer having a reflectance of a light with a wavelength of 400-1400 nm of not less than 50%, and
the infrared reflective layered product has an L value (brightness) of the surface on the layer (A) side thereof of not more than 40, and has an L value (brightness) of the surface on the layer (C) side thereof of not less than 70, wherein the layer (B) is made from a thermoplastic resin (I) with a glass transition temperature of not less than 120° C., and the layer (A) and the layer (C) are made from a thermoplastic resin (II) having a glass transition temperature lower than the thermoplastic resin (I), and wherein said thermoplastic resin (I) is a vinyl resin (I') which comprises a rubber-reinforced vinyl resin (I-1) obtained by polymerization of a vinyl monomer (ii) in a presence of a rubber-like polymer (i) and optionally a (co)polymer (I-2) of a vinyl monomer (ii), the content of the rubber-like polymer (i) being 5-40 parts by mass relative to 100 parts by mass of the thermoplastic resin (I).

2. The layered product according to claim 1, wherein the layer (A) is made from a resin containing an infrared transmittable coloring agent.

3. The layered product according to claim 1, wherein the layer (C) is made from a resin containing a white pigment.

4. The layered product according to claim 1, wherein said thermoplastic resin (II) is a styrene resin (II-1) which comprises a rubber-reinforced styrene resin (II-1-1) obtained by polymerization of a vinyl monomer (b) comprising an aromatic vinyl compound and optionally another monomer copolymerizable with the aromatic vinyl compound in a presence of a rubber-like polymer (a), and optionally comprises a (co)polymer (II-1-2) of a vinyl monomer (b), the content of the rubber-like polymer (a) being 5-40 parts by mass relative to 100 parts by mass of the styrene resin (II-1).

5. The layered product according to claim 4, wherein said rubber-like polymer (a) is at least one selected from the group consisting of ethylene-α-olefin rubbers, hydrogenated conjugated diene rubbers, acrylic rubbers, silicone rubbers and silicone/acrylic composite rubbers.

6. The layered product according to claim 5, wherein the vinyl monomer (b) constituting said styrene resin (II-1) comprises a maleimide compound unit, the content of the maleimide compound unit being 1-30 mass % relative to 100 mass % of the styrene resin (II-1).

7. The layered product according to claim 1, wherein said rubber-like polymer (i) is at least one selected from the group consisting of ethylene-α-olefin rubbers, hydrogenated conjugated diene rubbers, acrylic rubbers, silicone rubbers and silicone/acrylic composite rubbers.

8. The layered product according to claim 1, wherein a vinyl monomer (ii) constituting said thermoplastic resin (I) comprises a maleimide compound unit, the content of the maleimide compound unit being 1-30 mass % relative to 100 mass % of the thermoplastic resin (I).

9. The layered product according to claim 1, wherein said thermoplastic resin (I) has a glass transition temperature (Tg (I)) of 120-220° C., and said thermoplastic resin (II) has a glass transition temperature (Tg (II)) satisfying the following expression (1)

$$(Tg(I) - Tg(II)) \geq 10° C. \quad (1).$$

10. The layered product according to claim 1, which comprises a protective layer (E) provided on the outer surface of the layer (A) and/or the outer surface of the layer (C).

11. The layered product according to claim 1, which further comprises a water vapor barrier layer (D) layered on the outer surface of said layer (A) or said layer (C), or between said layer (A) and said layer (B) or between said layer (B) and said layer (C).

12. The layered product according to claim 11, which comprises a protective layer (E) which is provided on the layer (C) side as an outermost layer.

13. The layered product according to claim 1, wherein a thickness (HA) of the layer (A), a thickness (HB) of the layer (B) and a thickness (HC) of the layer (C) satisfy the following expressions (2) and (3):

$$0.5 \leq H_A/H_C \leq 1.3 \quad (2)$$

$$0.4 \leq (H_A + H_C)/H_B \leq 2.4 \quad (3).$$

14. The layered product according to claim 1, wherein the layer (C) is a colored resin layer having a reflectance of a light with a wavelength of 400-1400 nm of not less than 60%.

15. The layered product according to claim 1, wherein the layer (C) is a colored resin layer having a reflectance of a light with a wavelength of 400-1400 nm of not less than 70%.

16. The layered product according to claim 1, wherein the layer (C) is a colored resin layer having a reflectance of a light with a wavelength of 400-1400 nm of at least 80%.

17. The layered product according to claim 1, wherein the layer (C) is a colored resin layer having a reflectance of a light with a wavelength of 400-1400 nm of at least 95%.

18. A solar cell back sheet comprising the layered product according to claim 1.

19. A solar cell module comprising the solar cell back sheet according to claim 18.

* * * * *